United States Patent
Ypma et al.

(10) Patent No.: US 12,287,584 B2
(45) Date of Patent: Apr. 29, 2025

(54) METHODS AND APPARATUS FOR OBTAINING DIAGNOSTIC INFORMATION RELATING TO AN INDUSTRIAL PROCESS

(71) Applicant: ASML Netherlands B.V., Veldhoven (NL)

(72) Inventors: Alexander Ypma, Veldhoven (NL); Jasper Menger, Eindhoven (NL); David Deckers, Turnhout (BE); David Han, Tilburg (NL); Adrianus Cornelis Matheus Koopman, Hilversum (NL); Irina Lyulina, Son (NL); Scott Anderson Middlebrooks, Veldhoven (NL); Richard Johannes Franciscus Van Haren, Waalre (NL); Jochem Sebastiaan Wildenberg, Aarle-Rixtel (NL)

(73) Assignee: ASML NETHERLANDS B.V., Veldhoven (NL)

( * ) Notice: Subject to any disclaimer, the term of this patent is extended or adjusted under 35 U.S.C. 154(b) by 158 days.

(21) Appl. No.: 18/232,570

(22) Filed: Aug. 10, 2023

(65) Prior Publication Data
US 2024/0019788 A1 Jan. 18, 2024

Related U.S. Application Data

(63) Continuation of application No. 17/836,099, filed on Jun. 9, 2022, now Pat. No. 11,940,740, which is a (Continued)

(51) Int. Cl.
*G03F 7/00* (2006.01)
*G03F 9/00* (2006.01)
*G06F 16/26* (2019.01)

(52) U.S. Cl.
CPC .... *G03F 7/706837* (2023.05); *G03F 7/70525* (2013.01); *G03F 7/70616* (2013.01); *G03F 9/7092* (2013.01); *G06F 16/26* (2019.01)

(58) Field of Classification Search
CPC ......... G03F 7/706837; G03F 7/706839; G03F 7/706831; G03F 7/70633; G03F 7/70525;
(Continued)

(56) References Cited

U.S. PATENT DOCUMENTS

| 1,798,964 A | 3/1931 | Wintermute et al. |
| 6,184,935 B1 | 2/2001 | Iaquinto et al. |

(Continued)

FOREIGN PATENT DOCUMENTS

| CN | 101751317 | 6/2010 |
| CN | 102361014 | 2/2012 |

(Continued)

OTHER PUBLICATIONS

Notice of Allowance issued in corresponding U.S. Appl. No. 17/836,099, dated Feb. 13, 2024.
(Continued)

*Primary Examiner* — Steven H Whitesell
(74) *Attorney, Agent, or Firm* — Pillsbury Winthrop Shaw Pittman, LLP

(57) ABSTRACT

In a lithographic process, product units such as semiconductor wafers are subjected to lithographic patterning operations and chemical and physical processing operations. Alignment data or other measurements are made at stages during the performance of the process to obtain object data representing positional deviation or other parameters measured at points spatially distributed across each unit. This object data is used to obtain diagnostic information by performing a multivariate analysis to decompose a set of vectors representing the units in the multidimensional space
(Continued)

into one or more component vectors. Diagnostic information about the industrial process is extracted using the component vectors. The performance of the industrial process for subsequent product units can be controlled based on the extracted diagnostic information.

20 Claims, 20 Drawing Sheets

Related U.S. Application Data continuation of application No. 16/864,456, filed on May 1, 2020, now Pat. No. 11,385,550, which is a continuation of application No. 16/351,873, filed on Mar. 13, 2019, now Pat. No. 10,642,162, which is a continuation of application No. 15/915,674, filed on Mar. 8, 2018, now Pat. No. 10,274,834, which is a continuation of application No. 15/025,856, filed as application No. PCT/EP2014/068932 on Sep. 5, 2014, now Pat. No. 9,946,165.

(60) Provisional application No. 61/885,977, filed on Oct. 2, 2013.

(58) Field of Classification Search
CPC ............ G03F 7/70625; G03F 7/70616; G03F 7/70508; G03F 7/70491
See application file for complete search history.

(56) References Cited

U.S. PATENT DOCUMENTS

| | | | |
|---|---|---|---|
| 6,456,899 B1 | 9/2002 | Gleason et al. | |
| 6,603,804 B1 | 8/2003 | Khoini-Poorfard et al. | |
| 6,952,657 B2 | 10/2005 | Jahns et al. | |
| 7,019,777 B2 | 3/2006 | Sun | |
| 7,123,780 B2 | 10/2006 | Carrig | |
| 7,198,964 B1 | 4/2007 | Cherry et al. | |
| 7,379,611 B2 | 5/2008 | Sun et al. | |
| 7,460,237 B1* | 12/2008 | Cramer ............. | G03F 7/706839 |
| | | | 356/243.1 |
| 7,477,960 B2 | 1/2009 | Willis et al. | |
| 7,567,352 B2 | 7/2009 | Jin et al. | |
| 7,589,845 B1 | 9/2009 | Tian et al. | |
| 7,595,869 B1 | 9/2009 | Tian et al. | |
| 7,627,392 B2 | 12/2009 | Liu et al. | |
| 7,636,649 B2 | 12/2009 | Li et al. | |
| 7,734,437 B2 | 6/2010 | Tian et al. | |
| 7,742,889 B2 | 6/2010 | Tian et al. | |
| 7,761,178 B2 | 7/2010 | Tian et al. | |
| 7,761,250 B2 | 7/2010 | Tian et al. | |
| 7,808,613 B2 | 10/2010 | Lof | |
| 7,873,585 B2 | 1/2011 | Izikson | |
| 7,961,306 B2 | 6/2011 | Li et al. | |
| 8,142,966 B2 | 3/2012 | Izikson et al. | |
| 8,170,833 B2 | 5/2012 | Vuong et al. | |
| 8,173,450 B1 | 5/2012 | Tian et al. | |
| 8,173,451 B1 | 5/2012 | Tian et al. | |
| 8,175,831 B2 | 5/2012 | Izikson et al. | |
| 8,193,007 B1 | 6/2012 | Madriaga et al. | |
| 8,289,527 B2 | 10/2012 | Li et al. | |
| 9,110,461 B2 | 8/2015 | Morisawa et al. | |
| 9,946,165 B2 | 4/2018 | Ypma | |
| 10,274,834 B2 | 4/2019 | Ypma | |
| 2005/0055175 A1 | 3/2005 | Jahns et al. | |
| 2005/0071035 A1 | 3/2005 | Strang | |
| 2005/0071036 A1 | 3/2005 | Mitrovic | |
| 2005/0071038 A1 | 3/2005 | Strang | |
| 2005/0071039 A1 | 3/2005 | Mitrovic | |
| 2005/0115824 A1 | 6/2005 | Donohue et al. | |
| 2005/0185174 A1* | 8/2005 | Laan .................. | G03F 7/70683 |
| | | | 356/243.1 |
| 2005/0195398 A1 | 9/2005 | Adel et al. | |
| 2006/0259198 A1 | 11/2006 | Brcka et al. | |
| 2007/0031065 A1 | 2/2007 | Sun | |
| 2007/0185684 A1* | 8/2007 | Vuong ............... | G01N 21/4788 |
| | | | 702/182 |
| 2008/0030701 A1 | 2/2008 | Lof | |
| 2008/0170241 A1 | 7/2008 | Chard et al. | |
| 2008/0233661 A1 | 9/2008 | Lu et al. | |
| 2009/0063378 A1 | 3/2009 | Izikson | |
| 2009/0094001 A1 | 4/2009 | Vuong et al. | |
| 2009/0234687 A1 | 9/2009 | Tian et al. | |
| 2009/0240537 A1 | 9/2009 | Tian et al. | |
| 2009/0248339 A1 | 10/2009 | Tian et al. | |
| 2010/0057237 A1 | 3/2010 | Kettaneh et al. | |
| 2010/0112467 A1 | 5/2010 | Chung | |
| 2010/0161132 A1 | 6/2010 | Bharati et al. | |
| 2011/0081094 A1 | 4/2011 | Damkar | |
| 2011/0202298 A1 | 8/2011 | Izikson et al. | |
| 2011/0245955 A1 | 10/2011 | Li et al. | |
| 2011/0305404 A1 | 12/2011 | Lin et al. | |
| 2012/0208301 A1 | 8/2012 | Izikson et al. | |
| 2012/0218533 A1 | 8/2012 | Lyulina et al. | |
| 2013/0110477 A1 | 5/2013 | Pandev | |
| 2013/0148130 A1 | 6/2013 | Li et al. | |
| 2013/0162996 A1* | 6/2013 | Straaijer ............ | G03F 7/70633 |
| | | | 356/369 |
| 2013/0173042 A1 | 7/2013 | Morisawa et al. | |
| 2013/0204418 A1 | 8/2013 | Chang | |
| 2014/0172394 A1 | 6/2014 | Kuznetsov et al. | |

FOREIGN PATENT DOCUMENTS

| | | |
|---|---|---|
| CN | 102435629 | 5/2012 |
| EP | 5299608 | 6/2013 |
| EP | 2526409 | 10/2018 |
| EP | 3005411 | 12/2018 |
| JP | 2008-180712 | 8/2008 |
| JP | 2009-044215 | 2/2009 |
| JP | 2013-138121 | 7/2013 |
| KR | 100640663 | 10/2006 |
| KR | 1020080113352 | 12/2008 |
| KR | 1020090002106 | 1/2009 |
| WO | 2009/029851 | 3/2009 |
| WO | 2010/075166 | 7/2010 |
| WO | 2011/103048 | 8/2011 |
| WO | 2012/112959 | 8/2012 |
| WO | 2014059250 | 4/2014 |

OTHER PUBLICATIONS

Office Action issued in corresponding U.S. Appl. No. 17/836,099, dated Jun. 20, 2023.
International Search Report and Written Opinion mailed Nov. 27, 2014 in corresponding International Patent Application No. PCT/EP2014/068932.
Gregory A. Cherry et al., "Multiblock Principal Component Analysis Based on a Combined Index for Semiconductor Fault Detection and Diagnosis," IEEE Transactions on Semiconductor Manufacturing, vol. 19, No. 2, pp. 159-172 (May 2006).
C.V. Jiji et al., "PCA based Generalized Interpolation for Image Super-Resolution," Proceedings of the Fourth Indian Conference on Computer Vision, Graphics & Image Processing (ICVGIP 2004), Kolkata, India, 6 pages (2004).
Wikipedia, "Covariance matrix," Webpage http://en.wikipedia.org/wiki/Covariance_matrix, 5 pages (downloaded Aug. 26, 2013).
Wikipedia, "Data reduction," Webpage http://en.wikipedia.org/wiki/Data_reduction, 1 page (downloaded Aug. 26, 2013).
KLA Tencor, Klarity Automated Defect Data Analysis, "Klarity Defect," Webpage http://www.kla-tencor.com/front-end-defect-inspection/klarity-defect.html, 1 page (downloaded Sep. 24, 2013).
KLA Tencor, Klarity Spatial Signature Analysis (SSA), "Klarity SSA," Webpage http://www.kla-tencor.com/front-end-defect-inspection/klarityssa.html, 1 page (downloaded Sep. 24, 2013).
Qoniac, OVALiS, "On-product overlay optimization," Webpage http://www.qoniac.com/products/ovalis, 2 pages (downloaded Sep. 24, 2013).

(56) References Cited

OTHER PUBLICATIONS

Qoniac, ONYX, "Overlay Excursion Monitoring & Control," Webpage http://www.qoniac.com/products/ovalis/onyx, 1 page (downloaded Sep. 24, 2013).

Qoniac, OSMIUM, "Diagnostics Toolbox," Webpage http://www.qoniac.com/products/ovalis/osmium, 1 page (downloaded Sep. 24, 2013).

Chun-Yen Huang et al., "Overlay Improvement by Zone Alignment Strategy," Proc. of SPIE, vol. 6922, pp. 69221G-1-69221G-8 (Mar. 24, 2008).

Korean Office Action dated Oct. 31, 2017 in corresponding Korean Patent Application No. 10-2016-7011583.

Chinese Office Action dated Jan. 13, 2017 in corresponding Chinese Application No. 201480064342.8 (26 pages).

Korean Notice of Allowance issued in corresponding Korean Patent Application No. 10-2016-7011583, dated Jul. 2, 2018.

Turner K., et al: "Relationship between localized wafer shape changes induced by residual stress and overlay errors", Journal of Micro/Nanolithography, MEMS and MOEMS, vol. 11(1), Mar. 21, 2012.

Turner K., et al: "Predicting distortions and overlay errors due to wafer deformation during chucking on lithography scanners", Journal of Micro/Nanolithography, MEMS and MOEMS, vol. 8(4), Nov. 6, 2009.

Veeraraghaven S., et al.: "Simulation of non-uniform wafer geometry and thin film residual stress on overlay errors", Proc. of SPIE, vol. 7971, Apr. 20, 2011.

Korean Office Action issued in corresponding Korean Patent Application No. 10-2020-7016831, dated Jul. 30, 2020.

Office Action issued in corresponding U.S. Appl. No. 17/836,099, dated Nov. 24, 2023.

\* cited by examiner

METHODS AND APPARATUS FOR OBTAINING DIAGNOSTIC INFORMATION RELATING TO AN INDUSTRIAL PROCESS

This application is a continuation of pending U.S. patent application Ser. No. 17/836,099, filed Jun. 9, 2022, which is a continuation of U.S. patent application Ser. No. 16/864,456, filed May 1, 2020, now U.S. Pat. No. 11,385,550, which is a continuation of U.S. patent application Ser. No. 16/351,873, filed Mar. 13, 2019, now U.S. Pat. No. 10,642,162, which is a continuation of U.S. patent application Ser. No. 15/915,674, filed Mar. 8, 2018, now U.S. Pat. No. 10,274,834, which is a continuation of U.S. patent application Ser. No. 15/025,856, filed Mar. 29, 2016, now U.S. Pat. No. 9,946,165, which is the U.S. national phase entry of PCT Patent Application No. PCT/EP2014/068932, which was filed on Sep. 5, 2014, which claims the benefit of priority of U.S. Provisional Patent Application No. 61/885,977, filed Oct. 2, 2013, each of the foregoing applications is incorporated herein in its entirety by reference.

FIELD

This disclosure relates to methods of obtaining diagnostic information relating to an industrial process. An example of an industrial process for which the method has been developed is a lithographic process, which includes one or more steps of transferring a pattern from a patterning device onto a substrate using a lithographic apparatus. This disclosure further relates to a diagnostic apparatus, to a device manufacturing method, to a controller for an industrial process, and to a computer program product for causing a data processing apparatus to implement the methods and apparatus described.

RELATED ART

A lithographic process is one in which a lithographic apparatus applies a desired pattern onto a substrate, usually onto a target portion of the substrate, after which various processing chemical and/or physical processing steps work through the pattern to create functional features of a complex product. The accurate placement of patterns on the substrate is a chief challenge for reducing the size of circuit components and other products that may be produced by lithography. In particular, the challenge of measuring accurately the features on a substrate which have already been laid down is a critical step in being able to position successive layers of features in superposition accurately enough to produce working devices with a high yield. So-called overlay should, in general, be achieved within a few tens of nanometers in today's sub-micron semiconductor devices, down to a few nanometers in the most critical layers.

Consequently, modern lithography apparatuses involve extensive measurement or 'mapping' operations prior to the step of actually exposing or otherwise patterning the substrate at a target location. So-called advanced alignment models have been and continue to be developed to model and correct more accurately non-linear distortions of the wafer 'grid' that are caused by processing steps and/or by the lithographic apparatus itself. Not all distortions are correctable, however, and it remains important to trace and eliminate as many causes of such distortions as possible.

BRIEF SUMMARY

Modern lithographic process and products are so complex that issues due to processing are difficult to trace back to the root cause. Overlay and alignment residuals typically show patterns over the wafer (of the process and/or litho tool). This may be interpreted as a non-correctable quantity with respect to a predefined model, while visual inspection and detailed analysis of the fingerprint may give an indication of causes and correction strategies. The spatial pattern in the fingerprint is not used to quantify the fingerprint, nor the observation that multiple causes may show up simultaneously in the apparent fingerprint. Overlay measurements are not generally available for each individual wafer, and the relation to the processing history and context is not generally known or used. Furthermore, it is difficult and time-consuming to make a list of all possible sources of spatial variation for the machine and process at hand.

Aside from the problem of identifying causes of processing errors, process performance monitoring systems have been implemented which allow measurement of performance parameters to be made from processed products, which then are used to calculate corrections for use in processing subsequent products. A limitation with current performance monitoring systems is that there is a compromise between the amount of time and equipment dedicated to performance monitoring, and the speed and accuracy with which corrections can be implemented.

It would also be desirable to have a performance monitoring system that can detect problems at an early stage, rather than only detecting them when some performance parameter exceeds permissible limits.

The inventors have recognized that root cause finding, monitoring of wafer integrity and design of an appropriate correction strategy is therefore a subjective and laborious exercise. An embodiment of the invention aims to provide automated support that addresses one or more of the problems with known techniques, identified above.

In an aspect, there is provided a diagnostic apparatus for use in relation to an industrial process, the apparatus comprising a data processing apparatus programmed to perform the steps of:

receiving object data for a set of product units that have been subjected nominally to the same industrial process, the object data for each product unit representing one or more parameters measured on the product unit at points spatially distributed across the product unit;

defining a multidimensional space in which the object data for each of the product units can be represented as a vector;

performing a multivariate analysis on the object data to obtain one or more component vectors in the multidimensional space; and extracting diagnostic information about the industrial process using the component vectors.

In some embodiments, the multivariate analysis is performed on a representation of the object data that comprises a set of vectors in the multidimensional space, each of the vectors corresponding to one of the product units (or a group of product units). Such a vector may have elements representing measurements at different ones of the points spatially distributed across the product unit. In such an implementation, the object data prior to the multivariate analysis and the component vectors obtained by the multivariate analysis are both expressed as vectors in the same multidimensional space.

Alternative implementations are possible, in which the object data prior to the multivariate analysis is expressed as vectors in a different multidimensional space from the one in which the component vectors are expressed. Conversion between these spaces may be performed (explicitly or implicitly) either during or after the multivariate analysis. For example, in one alternative implementation, the object data is expressed in vectors of which each vector corresponds to one of the points and has elements representing measurements at the point across different ones of the product units. In another alternative, multivariate analysis is performed on the object data without expressing it as vectors in any particular multidimensional space.

In an aspect, there is provided a method of obtaining diagnostic information relating to an industrial process, the method comprising:

receiving object data for a set of product units that have been subjected nominally to the same industrial process, the object data for each product unit representing one or more parameters measured on the product unit at points spatially distributed across the product unit;

defining a multidimensional space in which the object data for each of the product units can be represented as a vector;

performing a multivariate analysis on the object data to obtain one or more component vectors in the multidimensional space; and extracting diagnostic information about the industrial process using the component vectors.

In an embodiment, the industrial process comprises a sequence of one or more lithographic processing steps performed on product units in the form of substrates, each lithographic processing step comprising one or more lithographic patterning operations followed by one or more physical and/or chemical processing operations. Alignment procedures in lithography generally involve measurements to made automatically across the substrate. These measurements can be captured and represented in the object data. In this way, the method of an embodiment of the invention in its most basic form can be implemented without requiring special measurements data capture, or knowledge of the processing context. The method is not limited, however, to the use of alignment measurements, nor is it limited in operation to lithographic processes.

The results of the multivariate analysis can be used in various ways to extract diagnostic information. Parts of the extraction can be automated, other parts can be user-driven, based on visualizations generated by the apparatus. The step of extracting diagnostic information may for example include designating certain product units as product units of interest based on the positions of their vectors when projected onto one or more of the component vectors.

The step of extracting diagnostic information may further comprise correlation observed between product units being designated as of interest according to the projection of their vectors onto the selected vector(s) and product units designated as of interest according to performance data representing one or more performance parameters measured for each product unit.

The step of extracting diagnostic information may further comprise receiving and using context data for each of the product units, the context data representing one or more parameters of the industrial process as applied to each individual product unit. The step of extracting diagnostic information may for example comprise identifying correlation between the identification of product units as being of interest based on the component vectors and one or more parameters in the context data.

In other embodiments, the step of extracting diagnostic information comprises:

receiving sparse object data for one or more further product units that have been subjected nominally to the same industrial process as the set of product units, the sparse object data for the further product unit(s) representing the one or more parameters measured on the product unit(s) at points spatially distributed across the product unit with a lower density than the measurements received for the set of product units, analyzing the sparse object data by reference to at least a subset of the component vectors identified by the multivariate analysis; and combining the sparse object data with the component vectors in accordance with the result of the analyzing step, thereby to reconstruct object data representing the one or more parameters measured on the further product unit(s) at points spatially distributed across the product unit with a higher density than the sparse object data.

One embodiment of the type just mentioned can be used in a performance monitoring system for the industrial process, where the sparse object data is monitoring data relating to a performance parameter of the industrial process.

The method may further comprise the step of generating one or more sets of correction data for use in controlling the industrial process when performed on further product units. The correction data may be applied for example as alignment corrections in a future lithographic step to correct distortions of the products introduced by a chemical and physical processing steps. The corrections may be applied selectively based on context criteria. The corrections may be applied so as to correct some of the identified component vectors and not others.

Where the industrial process comprises a mixture of lithographic pattering operations and physical and/or chemical operations, the diagnostic apparatus may be programmed to generate the correction data for applying corrections in a lithographic pattering operation.

The apparatus may further comprise a controller arranged to control a lithographic apparatus by applying corrections based on the extracted diagnostic information.

In aspect, there is provided a method of controlling an industrial process in which product units are subjected to one or more processing operations, the method comprising:

measuring a plurality of product units that have been subjected to some or all of the processing operations to obtain object data representing for each product unit one or more parameters measured on the product unit at points spatially distributed across the product unit;

using the object data to obtain diagnostic information by a diagnostic apparatus or method according to the invention as set forth above; and controlling the performance of the industrial process for subsequent product units based on the extracted diagnostic information.

In an aspect, there is provided a computer program product comprising machine readable instructions for causing a general purpose data processing apparatus to perform the steps of a method for obtaining diagnostic information as set forth above. The computer program product may further comprise machine readable instructions for causing the data processing apparatus to generate correction data and optionally context criteria.

In an aspect, there is provided a computer program product comprising machine readable instructions for causing a general purpose data processing apparatus to perform the steps of a method of controlling an industrial process as set forth above.

Further features and advantages of the invention, as well as the structure and operation of various embodiments of the present invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example only, with reference to the accompanying schematic drawings in which.

DETAILED DESCRIPTION OF EXEMPLARY EMBODIMENTS

Figure 1:
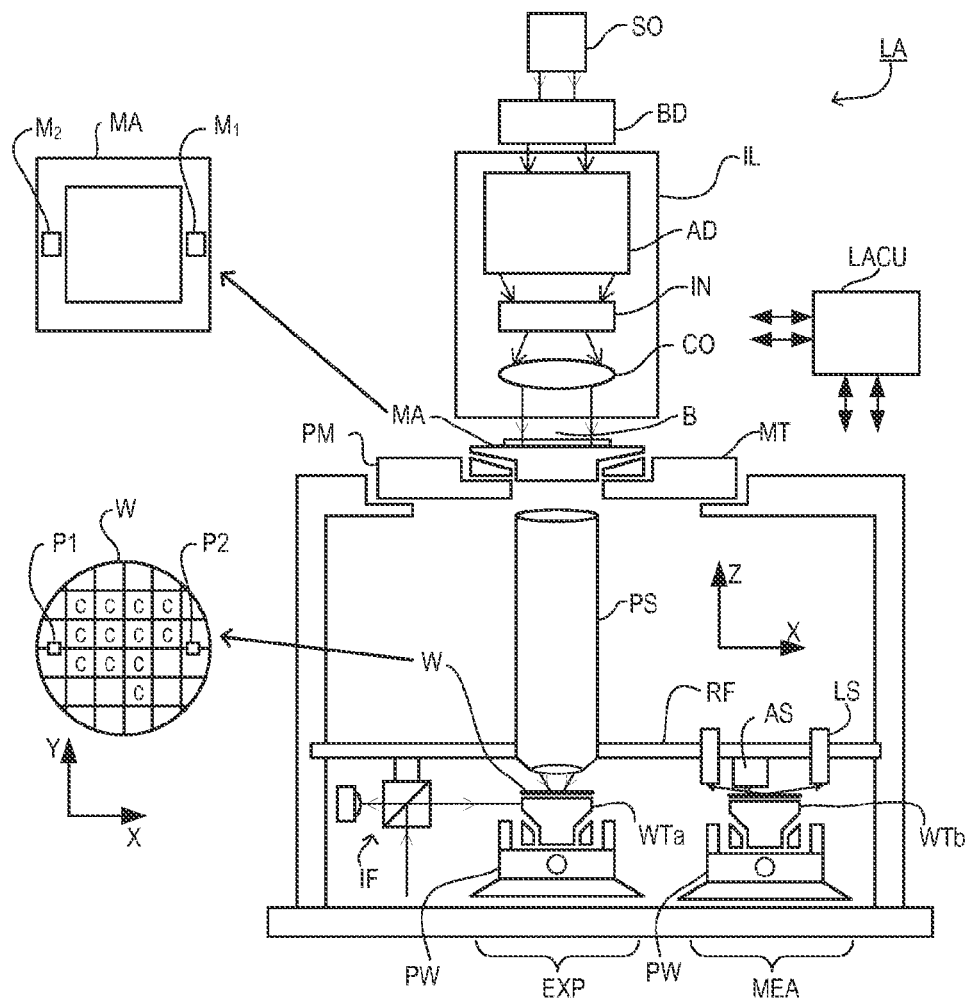
FIG. 1 depicts a lithographic apparatus according to an embodiment of the invention.

FIG. 1 schematically depicts a lithographic apparatus LA according to one embodiment of the invention. The apparatus comprises:

an illumination system (illuminator) IL configured to condition a radiation beam B (e.g. UV radiation or EUV radiation).

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WTa or WTb constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure. An embodiment of the invention disclosed herein can be used in a stand-alone fashion, but in particular it can provide additional functions in the pre-exposure measurement stage of either single- or multi-stage apparatuses.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WTa/WTb can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WTa/WTb may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WTa/WTb are kept essentially stationary, while an entire pattern imparted to the radiation beam is projected onto a target portion C at one time (i.e. a single static exposure). The substrate table WTa/WTb is then shifted in the X and/or Y direction so that a different target portion C can be exposed. In step mode, the maximum size of the exposure field limits the size of the target portion C imaged in a single static exposure.
2. In scan mode, the mask table MT and the substrate table WTa/WTb are scanned synchronously while a pattern imparted to the radiation beam is projected onto a target portion C (i.e. a single dynamic exposure). The velocity and direction of the substrate table WTa/WTb relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.
3. In another mode, the mask table MT is kept essentially stationary holding a programmable patterning device, and the substrate table WTa/WTb is moved or scanned while a pattern imparted to the radiation beam is projected onto a target portion C. In this mode, generally a pulsed radiation source is employed and the programmable patterning device is updated as required after each movement of the substrate table WTa/WTb or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Lithographic apparatus LA in this example is of a so-called dual stage type which has two substrate tables WTa and WTb and two stations—an exposure station and a measurement station—between which the substrate tables can be exchanged. While one substrate on one substrate table is being exposed at the exposure station EXP, another substrate can be loaded onto the other substrate table at the measurement station MEA so that various preparatory steps may be carried out. The preparatory steps may include mapping the surface height of the substrate using a level sensor LS and measuring the position of alignment marks on the substrate using an alignment sensor AS. The alignment marks are arranged nominally in a regular grid pattern. However, due to inaccuracies in creating the marks and also due to deformations of the substrate that occur throughout its processing, the marks deviate from the ideal grid. Consequently, in addition to measuring position and orientation of the substrate, the alignment sensor in practice must measure in detail the positions of many marks across the substrate area, if the apparatus LA is to print product features at the correct locations with very high accuracy. The measurement of alignment marks is therefore very time-consuming and the provision of two substrate tables enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations. An embodiment of the invention can be applied in an apparatus with only one substrate table, or with more than two.

The apparatus further includes a lithographic apparatus control unit LACU which controls all the movements and measurements of the various actuators and sensors described. LACU also includes signal processing and data processing capacity to implement desired calculations relevant to the operation of the apparatus. In practice, control unit LACU will be realized as a system of many sub-units, each handling the real-time data acquisition, processing and control of a subsystem or component within the apparatus. For example, one processing subsystem may be dedicated to servo control of the substrate positioner PW. Separate units may even handle coarse and fine actuators, or different axes. Another unit might be dedicated to the readout of the position sensor IF. Overall control of the apparatus may be controlled by a central processing unit, communicating with these sub-systems processing units, with operators and with other apparatuses involved in the lithographic manufacturing process.

Figure 2:
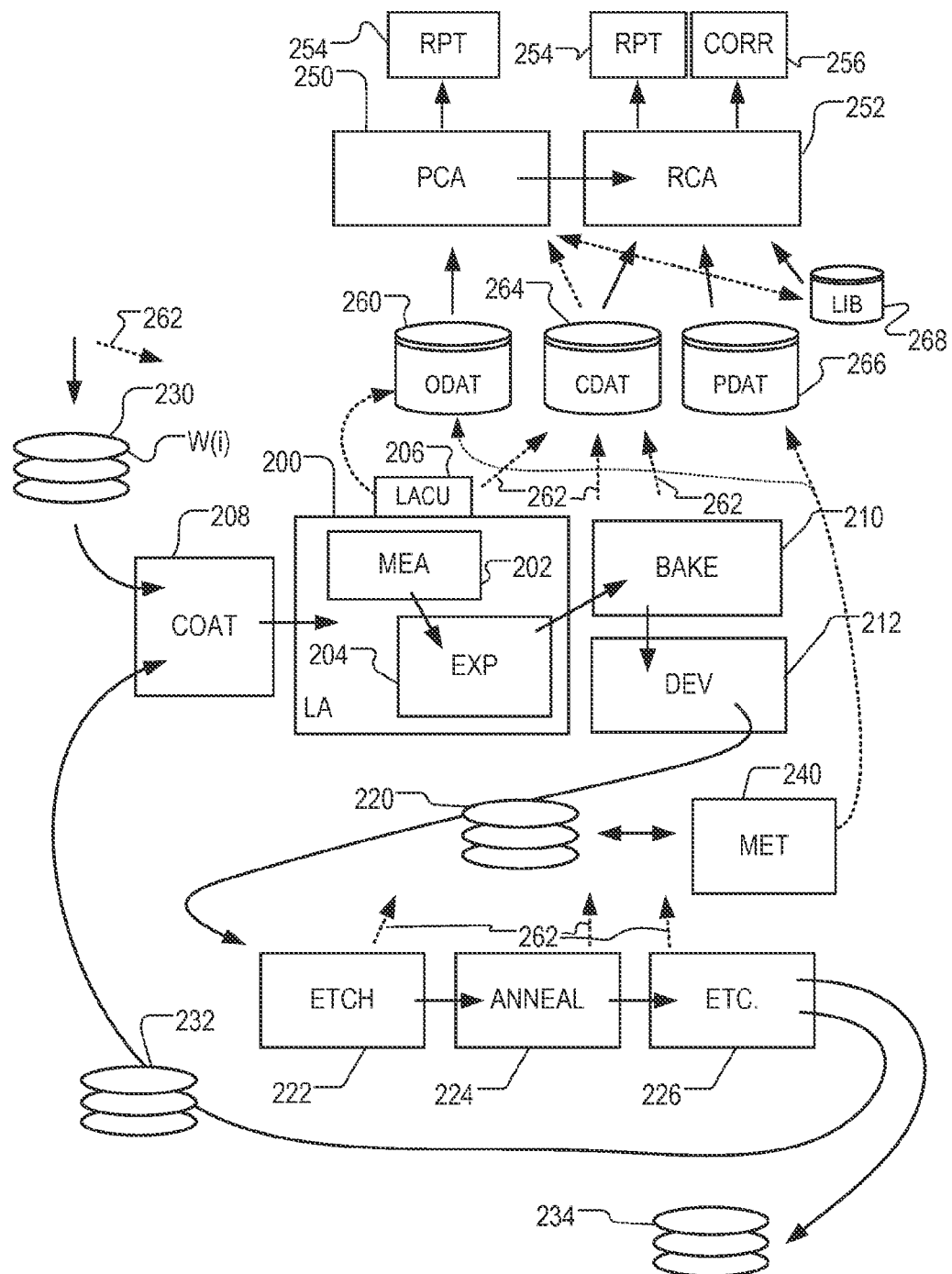
FIG. 2 shows schematically the use of the lithographic apparatus of FIG. 1 together with other apparatuses forming a production facility for semiconductor devices, the facility including first and second diagnostic apparatus according to embodiments of the present invention.

FIG. 2 at 200 shows the lithographic apparatus LA in the context of an industrial production facility for semiconductor products. Within the lithographic apparatus (or "litho tool" 200 for short), the measurement station MEA is shown at 202 and the exposure station EXP is shown at 204. The control unit LACU is shown at 206. Within the production facility, apparatus 200 forms part of a "litho cell" or "litho cluster" that contains also a coating apparatus 208 for applying photosensitive resist and other coatings to substrate W for patterning by the apparatus 200. At the output side of apparatus 200, a baking apparatus 210 and developing apparatus 212 are provided for developing the exposed pattern into a physical resist pattern.

Once the pattern has been applied and developed, patterned substrates 220 are transferred to other processing apparatuses such as are illustrated at 222, 224, 226. A wide range of processing steps are implemented by various apparatuses in a typical manufacturing facility. For the sake of example, apparatus 222 in this embodiment is an etching station, and apparatus 224 performs a post-etch annealing step. Further physical and/or chemical processing steps are applied in further apparatuses, 226, etc. Numerous types of operation can be required to make a real device, such as deposition of material, modification of surface material characteristics (oxidation, doping, ion implantation etc.), chemical-mechanical polishing (CMP), and so forth. The apparatus 226 may, in practice, represent a series of different processing steps performed in one or more apparatuses.

As is well known, the manufacture of semiconductor devices involves many repetitions of such processing, to build up device structures with appropriate materials and patterns, layer-by-layer on the substrate. Accordingly, substrates 230 arriving at the litho cluster may be newly prepared substrates, or they may be substrates that have been processed previously in this cluster or in another apparatus entirely. Similarly, depending on the required processing, substrates 232 on leaving apparatus 226 may be returned for a subsequent patterning operation in the same litho cluster, they may be destined for patterning operations in a different cluster, or they may be finished products to be sent for dicing and packaging.

Each layer of the product structure requires a different set of process steps, and the apparatuses 226 used at each layer may be completely different in type. Further, even where the processing steps to be applied by the apparatus 226 are nominally the same, in a large facility, there may be several supposedly identical machines working in parallel to perform the step 226 on different substrates. Small differences in set-up or faults between these machines can mean that they influence different substrates in different ways. Even steps that are relatively common to each layer, such as etching (apparatus 222) may be implemented by several etching apparatuses that are nominally identical but working in parallel to maximize throughput. In practice, moreover, different layers require different etch processes, for example chemical etches, plasma etches, according to the details of the material to be etched, and special requirements such as, for example, anisotropic etching.

The previous and/or subsequent processes may be performed in other lithography apparatuses, as just mentioned, and may even be performed in different types of lithography apparatus. For example, some layers in the device manufacturing process which are very demanding in parameters such as resolution and overlay may be performed in a more advanced lithography tool than other layers that are less demanding. Therefore some layers may be exposed in an immersion type lithography tool, while others are exposed in a 'dry' tool. Some layers may be exposed in a tool working at DUV wavelengths, while others are exposed using EUV wavelength radiation.

Also shown in FIG. 2 is a metrology apparatus 240 which is provided for making measurements of parameters of the products at desired stages in the manufacturing process. A common example of a metrology station in a modern lithographic production facility is a scatterometer, for example an angle-resolved scatterometer or a spectroscopic scatterometer, and it may be applied to measure properties of the developed substrates at 220 prior to etching in the apparatus 222. Using metrology apparatus 240, it may be determined, for example, that important performance parameters such as overlay or critical dimension (CD) do not meet specified accuracy requirements in the developed resist. Prior to the etching step, the opportunity exists to strip the developed resist and reprocess the substrates 220 through the litho cluster. As is also well known, the metrology results from the apparatus 240 can be used for quality control. They can also be used as inputs for a process monitoring system. This system can be to maintain accurate performance of the patterning operations in the litho cluster, by making small adjustments over time, thereby minimizing the risk of products being made out-of-specification, and requiring re-work. Of course, metrology apparatus 240 and/or other metrology apparatuses (not shown) can be applied to measure properties of the processed substrates 232, 234, and incoming substrates 230.

In order to provide tools for use in analyzing the sources of poor performance in lithographic production systems, there is now disclosed the provision of diagnostic apparatus 250 and 252, as illustrated at the top of FIG. 2. Similar tools in another form can be used to improve performance of the process monitoring system, as will also be described.

Each diagnostic apparatus 250, 252 is implemented by a combination of computer hardware and software, connected to receive data from the manufacturing facility just described. The computer hardware can be located in the same facility as the litho tool and other apparatus, or it can be located remotely and connected by telecommunications channels and/or removable storage. As will be explained, apparatus 250 and 252 can produce, for example, a report 254 identifying a likely cause, or a list of potential causes, for an identified error. It may produce ready-made corrections 256, which can be applied to the control systems of one or more of the apparatuses 200-226, to improve the performance of the system in processing product units in future. Corrections may be associated with context criteria indicating that they should be applied selectively to product units, depending on their individual processing history.

The first diagnostic apparatus 250 is designed to perform multivariate analysis, for example principal component analysis (PCA), to identify a number of component vectors contributing to deviations measured from the products themselves (substrates in this case). Different forms of multivariate analysis may be used, and PCA analysis is referred to herein purely as one example. In the specific example case of PCA, the identified component vectors are eigenvectors of a covariance matrix of the measurement data. The component vectors are orthogonal in the multidimensional space. In another method, called Independent Component Analysis (ICA), projections of the measurement data onto the component vectors are as independent as possible. The ICA technique leaves all second and higher order cross-correlations at zero, while the orthogonality of the PCA technique forces second order cross-correlations to be zero but may leave non-zero higher order cross-correlations. Apparatus 250 will be referred to hereinafter as the PCA apparatus for convenience, without intending any limitation.

Input for PCA apparatus 250 is object data, that is data measured on the product units themselves. In the particular embodiment illustrated and described herein, the object data, stored in a database 260 comprises in particular the alignment data conventionally obtained by the lithographic apparatus 200 using the alignment sensors AS in the measurement station 202. As this data representing detailed measurements of positions of marks in the X-Y plane of the substrate is obtained inherently as part of the normal patterning operation, little or no penalty is incurred by instructing the control unit 206 to store the data in the object data storage 260. In other embodiments, the object data may be measured elsewhere in the system, in addition to or instead of the alignment data measured by the litho tool 200. Alternatively or in addition to the alignment data, the object data may include height data obtained using level sensor LS, "wafer quality" signals from the alignment sensors AS and the like. The object data in storage 260 may also be obtained from other measurement apparatus, for example the metrology apparatus 240. In this way, the object data can include measurements directly or indirectly of parameters such as overlay, CD, side wall angle, mark asymmetry, leveling and focus. Further below, an embodiment will be described in which such object data can be used and analyzed to implement an improved process monitoring system in the manufacturing facility of FIG. 2. It is also possible that these parameters can be measured by apparatus within the litho tool 200 itself. Various prior publications describe special marks and/or or measurement techniques for this. For example information on mark asymmetry can be obtained using signals obtained at different wavelengths by the alignment sensors.

The second diagnostic apparatus 252 is for performing root cause analysis (RCA), for establishing correlation between component vectors identified by the PCA apparatus and performance and/or context data associated with individual substrates. This RCA apparatus 252 is arranged to receive the results of the multivariate analysis from PCA apparatus 250. RCA apparatus 252 then correlates the observed component vectors based on the object data alone, with one or more items of what we shall call context data and performance data. This context data may also be regarded as "history" data, as it is data not obtained from the products themselves but representing all or part of the processing history of individual product units (substrates), or batches of product units. Arrows 262 throughout the diagram illustrate how context data may come from any of the apparatuses. Context data may also arrive with the new substrates 230. For example, the context data may record what types of process steps have been applied, which individual apparatuses have been used in the performance of those steps, and what parameters were applied by those apparatuses (for example settings of temperature or pressure case while in etching apparatus 222, or parameters such as illumination modes, alignment recipes, etc. in the litho tool 200). The context data is stored in storage 264 for use by the RCA apparatus 252.

RCA apparatus 252 further has access to performance data, which may include for example measurements of overlay or CD, and which is stored in storage 266. While FIG. 2 shows separate storage 260, 264, 266 for each of the object data, context data and performance data, it will be appreciated that these different types of data may be stored in one common storage unit, or may be distributed over a larger number of storage units, from which particular items of data can be retrieved when required. Further, whilst the context data 262 is shown as emanating from each individual apparatus 222, 224, etc. the data may be collected through a central control system that controls the operation of the manufacturing plant as a whole.

Each record in the object data storage is labeled with a unique identifier. Noting that an individual wafer might pass repeatedly through the same litho tool in the course of a manufacturing process, or might pass through different tools all measuring the same marks, it is possible collect object data for the same product unit at different stages of the manufacturing process. Each of these instances of measurement can be treated in the analysis as an independent product unit. In the case where there are multiple instances of the same wafer being measured at different stages in a complex manufacturing process, however, the object data will include an identifier that uniquely identifies not only the individual wafer, but the stage of processing in which it has been measured. Typically in a lithographic process, different instances of the same wafer will be associated with patterning successive layers of a device structure. Knowledge of the relationship between these instances in the object data can be used as context data for diagnostic purposes in the RCA apparatus 252.

As the multivariate analysis in first diagnostic apparatus 250 can be performed independently of the context data, that apparatus can operate independently of the availability of any particular form or completeness of context data. However, context data can also be used by the first diagnostic apparatus if desired, for example to select certain subsets of the product units for inclusion in the data for multivariate analysis, rather than differentiating between product units only when the results of the multivariate analysis are displayed. As examples, so-called "chuck-to-chuck" comparisons can be important in a case where the litho tool has more than one "chuck" or substrate table (WTa, WTb in FIG. 1). When it has access to this part of the context data, the PCA apparatus 250 can select and analyze separately the product units that have been processed on the different chucks. The multivariate analysis may be performed so as to discriminate between subsets of product units without treating them entirely separately. Methods such as the one known as "mixtures of PCA" allow the analysis to be performed with regard to certain clusters within the object data, without explicitly separating their datasets. Instead, the different analyses per cluster are weighted with the likelihood that a certain vector (corresponding to a certain measured product unit) falls within a certain cluster.

In general, then, the multivariate analysis can be performed in a manner that discriminates between subsets of vectors at least partially by reference to context data. The context data may identify a particular apparatus or part of an apparatus involved in processing the product units, as in chuck-to-chuck comparison. The context data may a stage (step) in the industrial process at which the measurements represented in the vectors were obtained, as for example in layer-to-layer comparison.

Storage 268 is provided for library data which can be used for recognizing patterns in the results of the multivariate analysis. In particular, it has been mentioned already that certain fingerprint types can be recognized by experts familiar with the process, and this recognition brings with it certain knowledge of likely causes and effects. The library data can store a collection of reference vectors that can be matched with vectors identified from the object data. Once a reference vector has been matched, further information stored in association with it can be retrieved from storage and used to guide the further operation of PCA apparatus 250 and/or RCA apparatus 252. For example, the data stored with a "swirl" fingerprint in the library might comprise the name label "swirl" and hints to look for correlation between this fingerprint and annealing operations in the context data for the affected product units.

Object Data Example: Litho Tool Alignment Data

Figure 3:
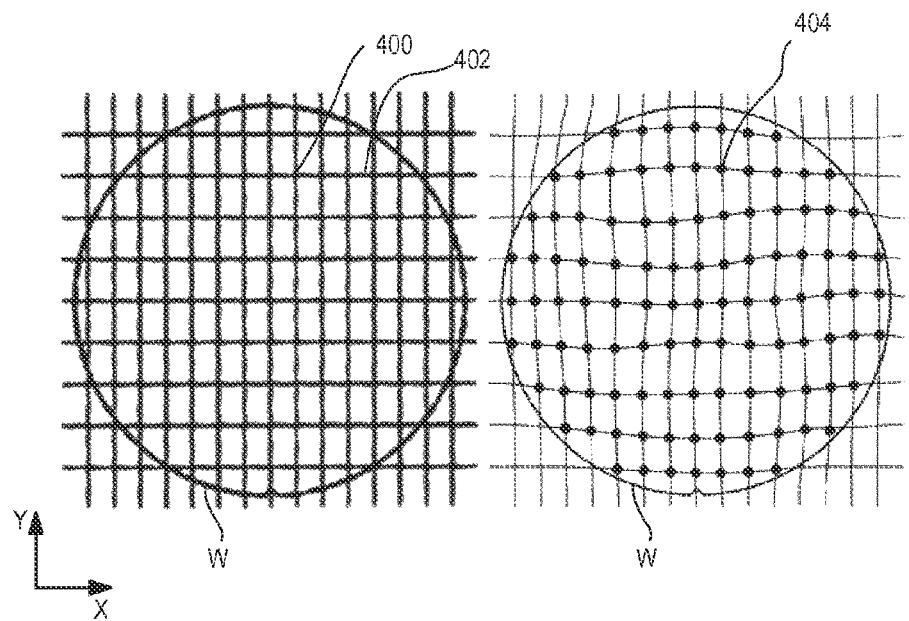
FIGS. 3 and 4 illustrate the principles of advanced alignment measurements and wafer grid corrections applied in a lithographic apparatus of the production facility.
Figure 4:
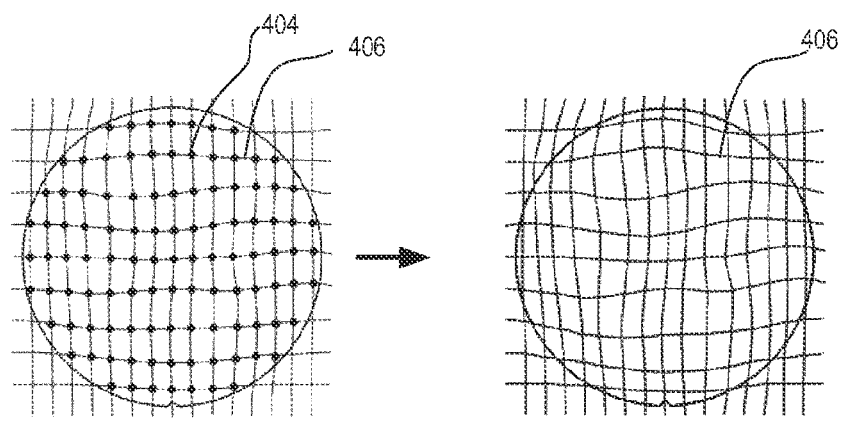

As explained above, the diagnostic methods and apparatus disclosed herein employ object data that is data measured from points distributed spatially over each product unit. In the example of a lithographic production facility where the product units are semiconductor substrates (wafers), a particularly interesting source of comprehensive object data is the set of measurements performed in the litho tool to characterize each wafer and the patterns previously deposited upon it. These measurements are used to obtain parameters for alignment models, that are used in a new patterning step to control accurately the positioning of patterns applied in relation to features already present Standard alignment models have six parameters (effectively three per direction X & Y) and in addition there are more advanced alignment models. On the other hand, for the most demanding processes currently in use and under development, to achieve the desired overlay performance requires more detailed corrections of the wafer grid. While standard models might use fewer than ten parameters, advanced alignment models typically use more than 15 parameters, or more than 30 parameters. Examples of advanced models are higher order wafer alignment (HOWA) models, zone-alignment (ZA) and radial basis function (RBF) based alignment models. HOWA is a published technique based on second, third and higher order polynomial functions. Zone alignment is described for example in Huang et al, "Overlay improvement by zone alignment strategy", Proc. SPIE 6922, 69221G (2008). RBF modeling is described in published patent application US 2012/0218533. Different versions and extensions of these advanced models can be devised. The advanced models generate a complex description of the wafer grid that is corrected for, during the exposure of the target layer. RBF and latest versions of HOWA provide particularly complex descriptions based on tens of parameters. This implies a great many measurements are required to obtain a wafer grid with sufficient detail. FIGS. 3 & 4 illustrate the form of alignment information that can be used to correct for wafer grid distortion as measured by the alignment sensor AL on alignment marks (targets) 400 in a previous layer on wafer (substrate) W. Each target has a nominal position, defined usually in relation to a regular, rectangular grid 402 with axes X and Y. Measurements of the real position 404 of each target reveal deviations from the nominal grid. The alignment marks may be provided within device areas of the substrate, and/or they may be provided in so-called "scribe lane" areas between device areas.

As illustrated in FIG. 4 the measured positions 404 of all the targets can be processed numerically to set up a model of a distorted wafer grid 406 for this particular wafer. This alignment model is used in the patterning operation to control the position of the patterns applied to the substrate. In the example illustrated, the straight lines of the nominal grid have become curves, indicating use of a higher order (advanced) alignment model. It goes without saying that the distortions illustrated are exaggerated compared to the real situation. Alignment is a unique part of the lithographic process, because it is the correction mechanism able to correct for deviations (distortions) in each exposed wafer. The alignment measures positions of alignment targets formed in a previous layer. The inventors have recognized that alignment data (and related data such as level sensor data) is always collected and always available. By finding a way to exploit this data as a resource for use in root cause analysis, the methods and apparatuses described herein greatly increase the practicality of such analysis.

First Diagnostic Apparatus—Background

Figure 5:
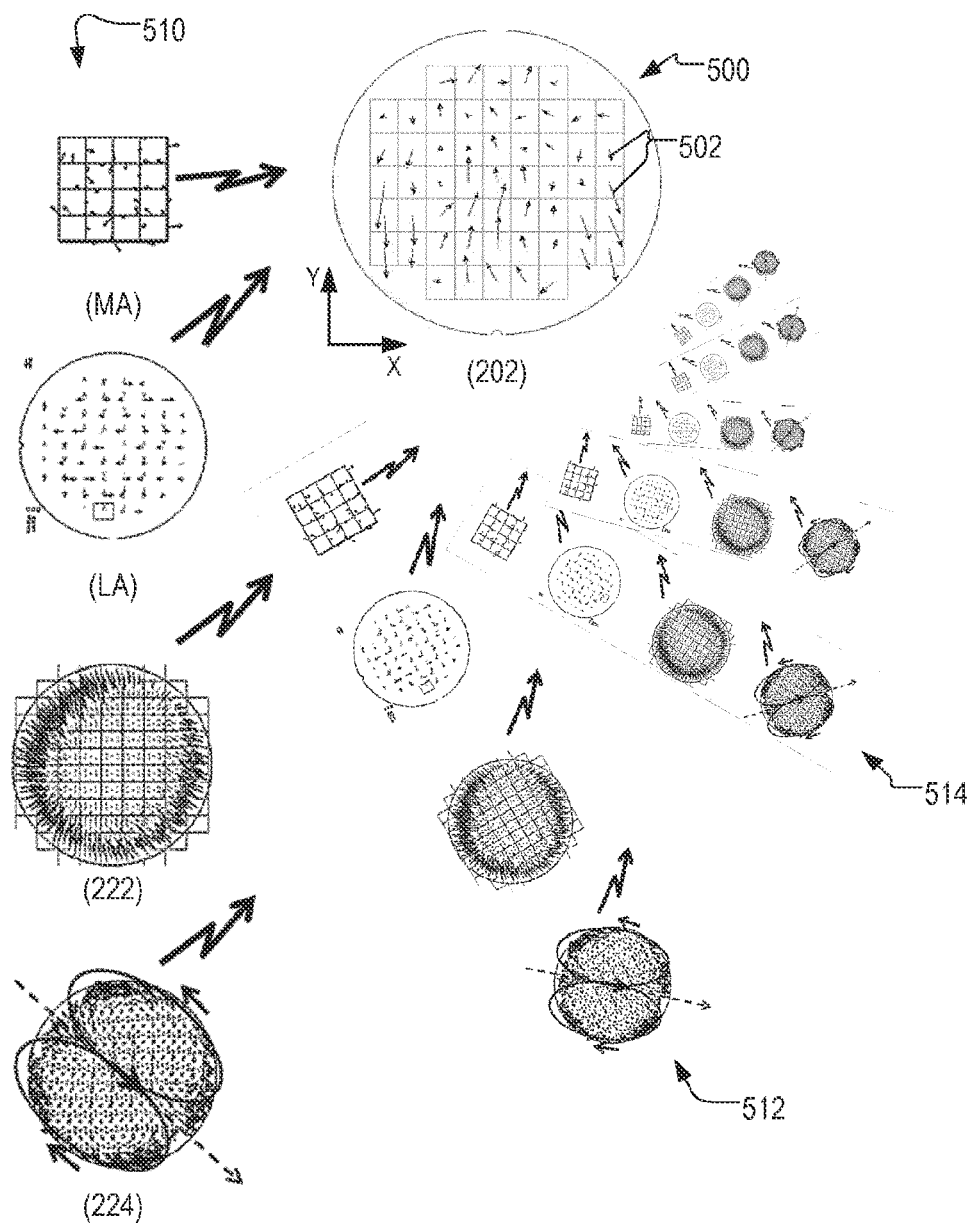
FIG. 5 illustrates figuratively the combination of various "fingerprints" in an observed example of alignment measurements.

FIG. 5 illustrates at 500, a very simple illustration of alignment data that may be measured across a substrate at the measurement station 202 of the litho tool 200. Each small arrow represents the position and magnitude of a mark position measured by the alignment sensor AS, relative to a nominal position, for a particular mark on the substrate. The collection of positional deviations measured at points spatially distributed over the wafer is an example of object data for one particular product unit. All the product units have the same spatial distribution of marks and measurements, but the actual deviations are generally unique to each wafer. Analysis of the object data (wafer measurements) over a population of product units can be performed so as to reveal various "fingerprints" that may be hidden in the data. It is known that any of the different steps in the production of the processed substrate can contribute its own fingerprint to the distribution of position errors across the substrate. At 510, there are shown four example contributions. The first contribution known as writing error, comes from errors the patterning device (reticle) MA. The writing error and may also include distortions caused by the reticle. Another contribution of error is in the operation of the litho tool LA. In this example, the deviations are small and alternate in alternating fields, illustrating a typical "scan up, scan down" (SUSD) error distribution. These errors, that may be referred to in lithography as the "machine fingerprint" are distributed with a relatively high spatial frequency across the substrate.

Further contributions to the wafer measurements are so-called "process fingerprints" that arise from processing steps performed outside the litho tool. The third contribution illustrated in FIG. 3 is a typical pattern of distortion suffered by the product in the etching apparatus 222. Errors are generally aligned radially, and are larger towards the periphery of the substrate. This type of pattern resembles a "sombrero" pattern. A fourth type of fingerprint illustrated in FIG. 3 is a so called "dual swirl" pattern, such as may be imposed in a thermal annealing step, for example in the apparatus 224. When a substrate has been subjected to these different steps, and is subsequently reloaded and measured in the litho tool measurement station 202, or in any metrology apparatus, a complex pattern of position errors that is a combination of all these different fingerprints may be observed, as shown at 500. Bearing in mind that a real product may have gone through dozens of process steps, including many cycles of patterning and processing in different apparatuses and different types of apparatuses, it becomes very difficult to know which types of apparatus, let alone which individual apparatuses, have contributed to errors present in the finished product. The contributions of these additional processing cycles are illustrated schematically at 512, 514, etc. Moreover, the fact that one of these characteristic fingerprints is strongly present in the object data does not necessarily indicate a strong source of error. For example, the litho tool SUSD fingerprint may be present strongly without contributing anything to overlay error, if the same tool or a tool having a similar fingerprint is used to pattern subsequent layers.

The PCA apparatus 250 exploits the availability of such object data stored for many individual product units (wafers) to extract useful information in an automated fashion. Component vectors are identified, each component vector corresponding to one of the fingerprints present in the object data. Operation of the PCA apparatus does not depend on the availability of context data or even performance data. The RCA apparatus 252 is optional according to the present disclosure, but can be used where context data is available, to analyze the context data together with the PCA analysis results, to further identify suspect apparatuses and opportunities for process improvement. Operation of RCA apparatus can be by a mixture of automated and manual steps.

Figure 6:
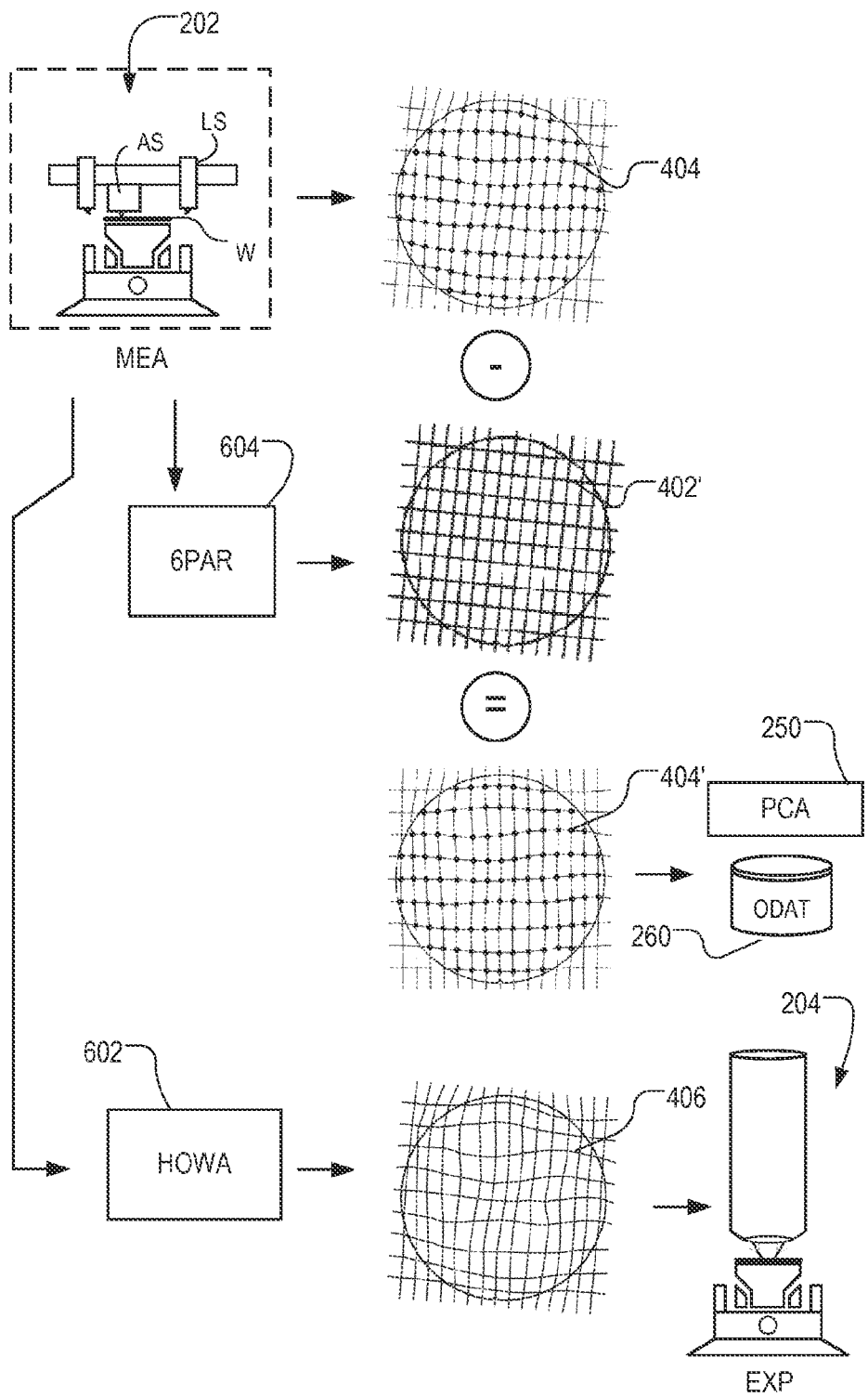
FIG. 6 shows the extraction of object data from alignment data by the first diagnostic apparatus in an embodiment of the invention.

FIG. 6 illustrates the collection of object data in the embodiment of FIG. 2, during performance of a patterning operation by litho tool 200. As already described, measurement station 202 of the litho tool 200 uses alignment sensors AS to measure positional deviations 404 of individual marks, spatially distributed across the substrate W. As mentioned above with reference to FIGS. 4 and 5, alignment models used in lithography can be of low order or high order (advanced) type. In the present example, a higher order correction module 602 calculates an alignment model 406 according to the HOWA method, mentioned above. This alignment model is used at the exposure station 204 to apply a pattern to substrate. For the purposes of the PCA apparatus 250, we propose to use residual data, rather than the deviations 404 as measured by the alignment sensors. This is because, in a modern high-performance lithography apparatus, most of the measured deviation will be compensated by the alignment model. Therefore performance improvements and diagnostic methods concentrate on detecting and eliminating the small deviations that remain uncorrected by the model. One option would therefore be to use as the object data, residual deviations that are not corrected by the HOWA model. In the present example, however, the designers have made a different choice.

In the present embodiment it is chosen to use residuals after subtraction of only a low order correction, so that high order deviations, even though some of them may be compensated by the HOWA model in operation of the litho tool, are nevertheless revealed in the object data. Leaving high order deviations in the residuals may facilitate diagnostic interpretation of the resulting component vectors. The HOWA model corrects low order and high order deviations simultaneously. To make a low order correction accessible for calculation of residuals, in the present embodiment, a traditional 6-parameter (6 PAR) model 402' is separately calculated by a unit 604. The 6 PAR calculating unit calculating unit 604 may be provided already as part of the litho tool management software, or it may be provided specially as part of the diagnostic apparatus. The low order model 402' is subtracted from the measured deviations 404 to obtain residual deviations 404'. These residual variations 404' are collected as the object data for use in the PCA apparatus 250. In embodiments using a different higher order model, or no higher order model at all, the 6PAR calculation unit 604 may be provided already, and the residuals 404' may be calculated already. For example, the RBF model described in the prior art mentioned above, is generally applied to correct only the higher order deviations, after low order deviations have been corrected by a low order model such as the 6PAR model.

In other embodiments, for example, where level sensor (LS) data is used, the deviations may again be used as object data, after subtraction of some corrective model, depending on which fingerprints are of most interest. In applications outside lithography, similar considerations can be applied to determine the best form of object data upon which to base the analysis.

Fingerprint Decomposition

Figure 7A:
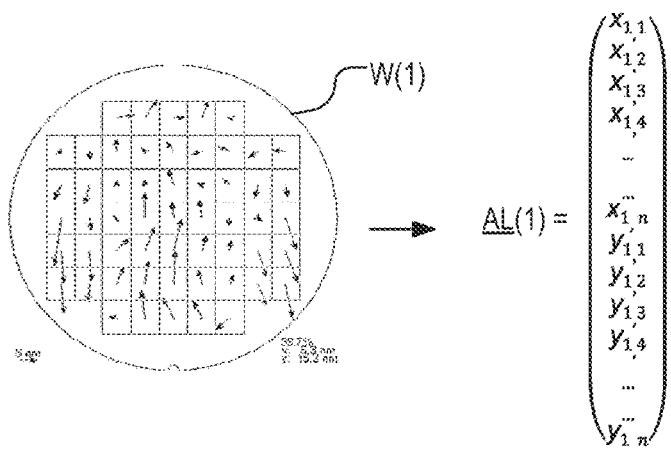
FIGS. 7A and 7B show the form of object data in one embodiment of the invention for two example product units.
Figure 7B:
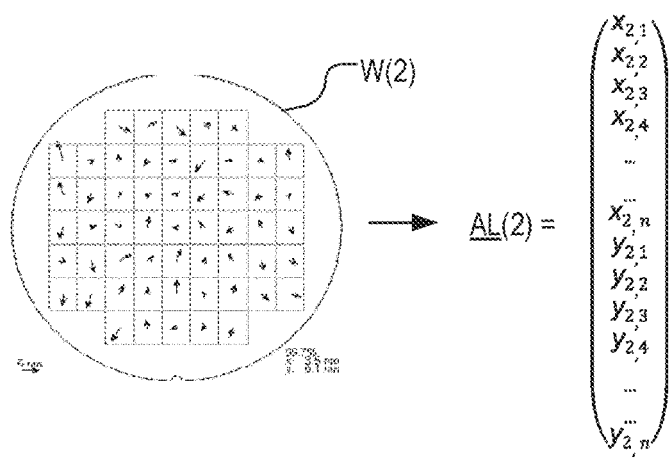

FIGS. 7-9 illustrate steps in the analysis performed by the first diagnostic apparatus in the example embodiment. In FIG. 7A, we show the representation of the residual deviations on a first substrate W(1) as a vector AL(1). Each measured deviation has x and y components. It is assumed that each wafer has n alignment marks to be measured (or at least, for the purposes of this analysis, residual deviations for n marks are collected in the object data). The x deviation for the first mark on wafer number 1 is labeled $x_{1,1}$, while the x deviation for the n-th mark on the first substrate is labeled $x_{1,n}$. The vector AL(1) comprises all the x and y values for the marks on the first substrate. Similarly, as shown in FIG. 7B, the residual deviations for a second wafer W(2) are stored as a vector AL(2). The components of this vector are the residual deviations for the n marks as measured on the second wafer, with labels $x_{2,1}$ to $x_{2,n}$ and $y_{2,1}$ to $y_{2,n}$. In an alternative implementation, the data can be organized into a vector per mark position, that is to say a vector X(1) would comprise the first x value for all the wafers, a wafer X(2) would comprise the second x value for all the wafers and so forth. The alternative implementation will be explained in a separate section, further below.

Figure 7C:
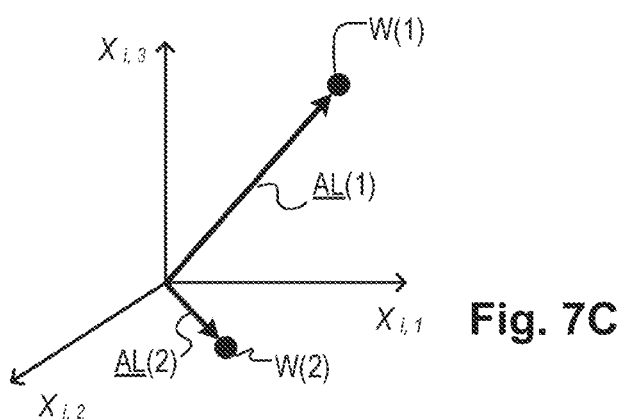
FIG. 7C shows a simplified schematic representation of each product unit as a point or vector in a multidimensional space.

FIG. 7C illustrates how the "position" of each product unit (wafer) W(1), W(2), etc. can be plotted in a multidimensional space, having as many dimensions as there are elements in the vectors AL(1), AL(2), etc. In view of the limitations of representing a multidimensional space in a flat drawing, FIG. 7C represents only the first three dimensions, namely the residual deviations in the x direction for the first three marks on each substrate.

Figure 8A:
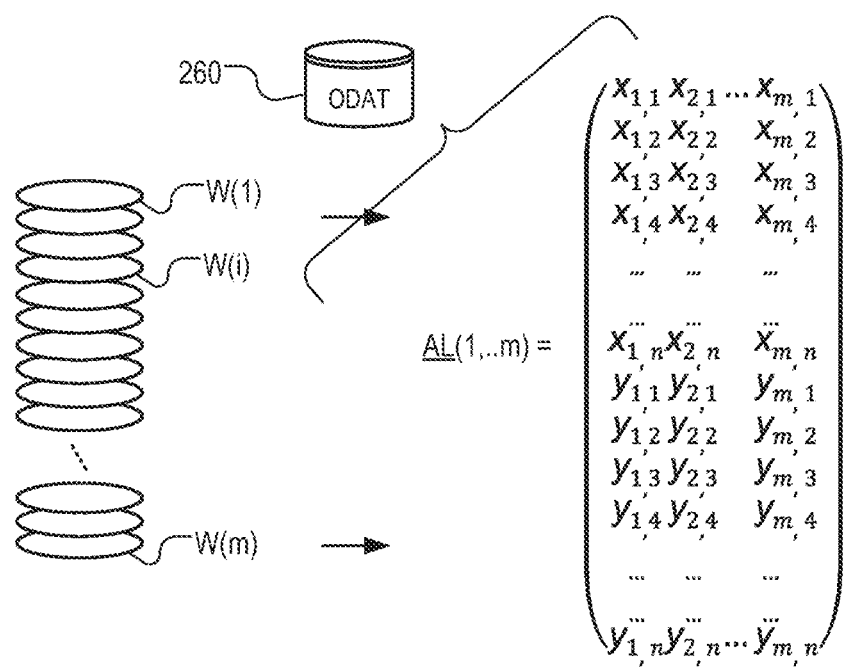
FIG. 8A shows the creation of a measurement data matrix comprising object data for a set of product units and FIG. 8B shows a schematic representation of those product units as points in the multidimensional space.
Figure 8B:
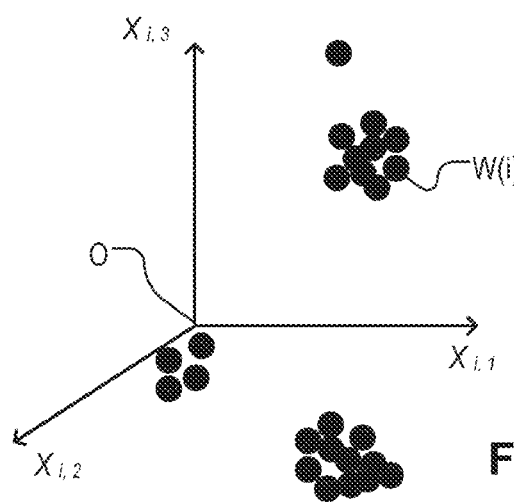

Referring now to FIG. 8A, it is seen how the vectors comprising the residual deviations for a full set of m wafers can be assembled into a single matrix AL(1-m). It will be appreciated that the dimensions of this matrix may be several hundred rows and several hundred columns, depending on the number n of marks measured per wafer and the number m of wafers included in the analysis.

FIG. 8B, this shows again how each product unit W(i) can be represented by a point defined by its vector AL(i) in the multidimensional space. This is possible because corresponding elements of the vector AL(i) of each wafer correspond to the same location in the spatial distribution of measurement points (alignment marks) on the product units (wafers). In an ideal production situation, all wafers would naturally be positioned on the origin O, with zero positional deviation at any mark. In a real situation, although they are distributed away from the origin O, but they are not randomly distributed throughout the multidimensional space. Rather, as shown schematically in FIG. 8B, the points representing the ends of the individual vectors AL(i) will be distributed with some degree of coherence, for example with a number of clusters being recognizable, and one or more "outliers", in a typical distribution. On the other hand, while these clusters are visible in the schematic, three-dimensional plot of FIG. 8B, they are not readily identifiable when buried in a hundred-or more dimensional space.

Figure 9A:
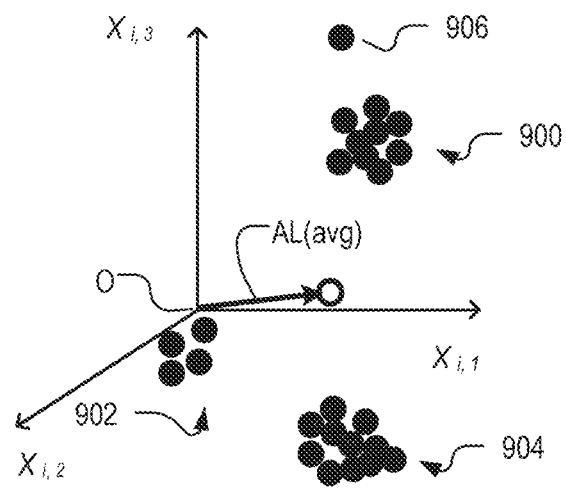
FIGS. 9A, 9B, 9C and 9D illustrate steps in a multivariate analysis step performed by the first diagnostic apparatus to decompose the distribution of object data represented in FIG. 8 into a plurality of component vectors.
Figure 9B:
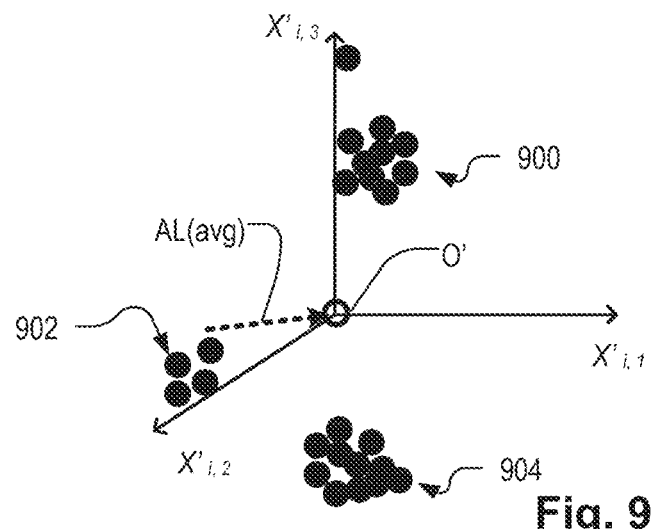

FIGS. 9A and 9B show how the first diagnostic apparatus, the PCA apparatus 250 of the disclosed apparatus decomposes the multidimensional distribution of vectors into component vectors, referred also to as fingerprints. For this purpose, various techniques are known in multivariate statistics that can be applied, whether individually or in combination, to extract a set of component vectors from the mass of data represented in the object data.

In the step illustrated at FIG. 9A, there is calculated an average vector AL(avg) representing the average of all the vectors AL(1) to AL(m) represented in the object data. At FIG. 9B, the origin of the multidimensional space is shifted by subtracting the average vector from each of the vectors expressed in the original multidimensional space. This can be seen by the relabeling of the axes in FIG. 9B with x' instead of x. It will be understood that this shifting of the origin O to a new position O' is a mathematical step that can be implemented by actually subtracting the average vector from the individual vectors where they are stored, or by applying an offset when the values are used in calculation. The values can be normalized to an arbitrary scale, if desired.

The result after the step of FIG. 9B is a measurement matrix AL(1-m) of dimension 2n×m in which the columns are individual vectors relative to the new origin O'. PCA apparatus computes from this matrix a data covariance matrix. Using conventional notation, covariance matrix is designated $\Sigma$ and has dimension 2n×2n and has entries:

$$\Sigma_{i,j} = E[(\alpha_i - \mu_i)(\alpha_j - \mu_j)]$$

where $\Sigma_{i,j}$ is the entry in row i, column j of the matrix, $\alpha_i$ and $\alpha_j$ are the $i^{th}$ and $j^{th}$ rows of entries in the measurement matrix (for example $\alpha_1 = [x_{1,1} \ldots x_{1,m}]$, $\alpha_{2n} = [y_{n,1} \ldots y_{n,m}]$), $E(\alpha_i - \mu_i)$ is the expectation of the entries in $\alpha_i$ relative to the mean of those entries and $E(\alpha_j - \mu_j)$ is the expectation of the entries in $\alpha_j$ relative to the mean of those entries. (Note that, if the values in the measurement matrix have already been adjusted be relative to the mean, as shown in FIG. 9, then the terms $E(\alpha_i - \mu_i)$ and $E(\alpha_j - \mu_j)$ can be simplified to $E(\alpha_i)$ and $E(\alpha_j)$.) Using a compact matrix notation, the covariance matrix can be expressed as:

$$\Sigma = E[AL(1-m) * AL(1-m)^T]$$

where superscript T indicates the transpose operator. As an alternative to a covariance matrix, a correlation matrix can be calculated. The difference is simply that correlation values have been normalized to a range from 0 (uncorrelated) to 1 (completely correlated).

The PCA apparatus then exploits the spatial correlation between alignment errors in different targets or marks to project the data onto eigenvectors of the covariance matrix. These eigenvectors are an example of the component vectors mentioned in the introduction and claims. These eigenvectors can be interpreted as representing wafer-to-wafer fingerprints that contribute to the overall fingerprint of each wafer. Principal component analysis or PCA is one known decomposition technique by which this decomposition into component vectors can be performed. Some other forms of decomposition may be also of interest to use, as will be mentioned. The references to principal component vectors and PCA analysis in the present description should be interpreted broadly to encompass these various alternative decomposition techniques, unless the context requires otherwise.

Figure 9C:
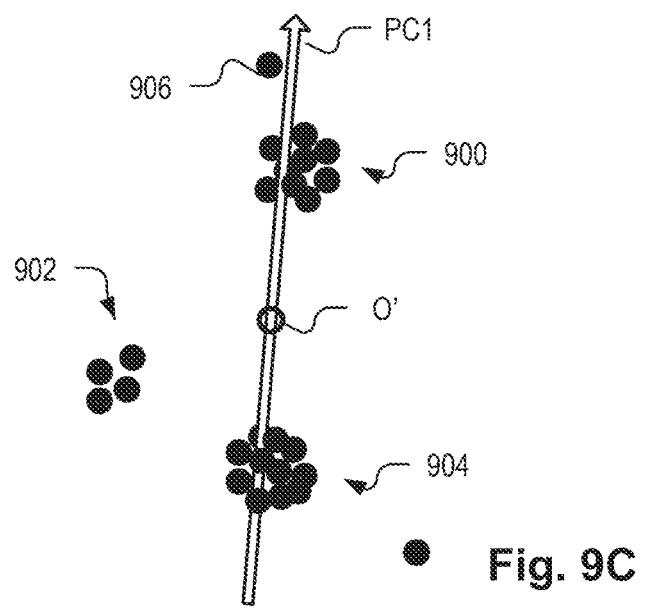
Figure 9D:
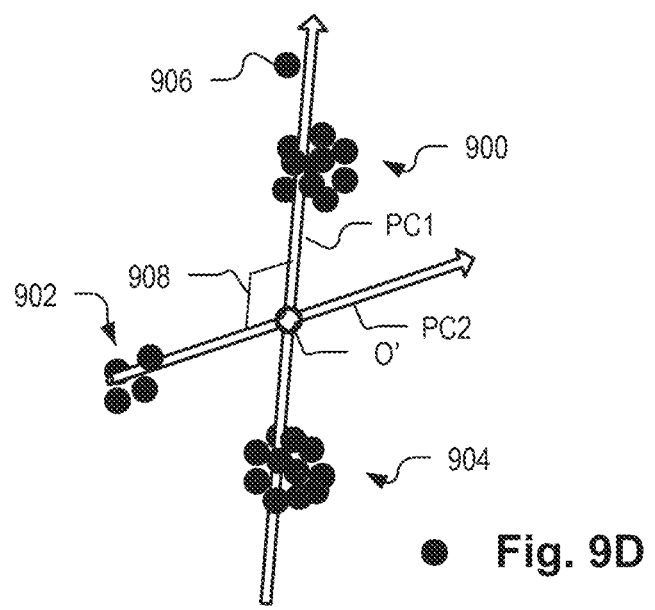

FIG. 9C illustrates a first component vector PC1 which has been found by PCA analysis of the covariance matrix illustrated in FIG. 8A. This vector PC1 emerges from the calculations and can be understood qualitatively as the single vector which captures the most variance of the measured points in the multidimensional space. In other words, each measured vector can be represented (very approximately) by a scalar coefficient times first component vector. In the present case, since most of the measured vectors fall in two clusters 900 and 904, the direction of component vector PC1 is unsurprisingly aligned so as to pass through these two clusters, while being influenced also by the smaller cluster 902 and the outlier 906. A next component vector PC2 is defined, as illustrated in FIG. 9D. Each component vector PC1, PC2, etc. is defined as the one which captures the most variance of the distribution of points in the object data, after subtracting from each point the approximation represented in terms of the vector or vectors already identified. The component vectors in the PCA process are orthogonal, as indicated at 908. The process continues until a sufficient number of component vectors have been identified, but whatever measured is set by the designer and operator of the apparatus. Note that, while the finding of these component vectors has been described as an iterative process, finding and subtracting each component vector in turn, for practical implementations both parallel and sequential methods are available.

If the points in the multidimensional space were distributed entirely at random, the number of component vectors required to describe the distribution with sufficient accuracy would hardly be fewer than 2n, the number of elements in each measurement vector. However, in a real data set there is a high degree of spatial coherence in the deviations or other measurements distributed across the wafer. Therefore substantial correlations between entries are expected, and it is found that the distribution can be very well described as a combination of relatively few component vectors. Another term for this process of finding the component vectors is therefore dimensionality reduction. Moreover, these component vectors may be expected to have a fairly direct relationship with physical effects in the manufacturing process, and thereby offer keys to finding the cause of problems. Based on the decomposition that has been illustrated schematically in FIG. 9, the first diagnostic apparatus 250 can deliver a set of component vectors, onto which the measured vector of each product unit can be projected for analytic purposes.

It should be noted that the measurements used as object data in the multivariate analysis may be only a subset of the measurements taken and available. There are various reasons for selecting only certain measurements. One reason is simply to reduce the amount of data processing required. More particularly, if one wants to analyze patterns across the whole wafer, one could restrict the analysis to an interfield subset of marks, that is one mark per field, covering the full wafer ("field" is a term for the target portions C of FIG. 1). Conversely, to analyze intrafield patterns, a subset of measurements may be ones taken from only a few fields, but with several marks distributed across each field. Another example would be a subset specifically relating to one layer in one product type; other subsets relate to other layers and other products. Multivariate analysis can be done separately on each subset so that the database is relevant to each litho step.

It should be noted that performing the multivariate analysis after subtracting an average vector is only one possible implementation. Also, performing the multivariate analysis using a covariance matrix is only one possible implementation. Other choices are possible, as is known in the art of PCA techniques and multivariate analysis generally.

Further the decision to combine all x and y mark positions into one vector is merely one design option. The different coordinates x and y could be treated entirely separately, if preferred.

Figure 10A:
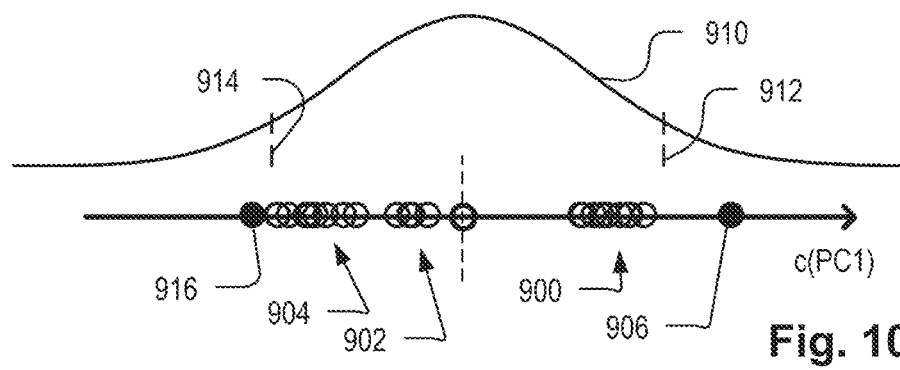
FIGS. 10A, 10B and 10C illustrate distributions of product units projected into one- and two-dimensional distributions using the component vectors identified in the multivariate analysis.

FIG. 10 illustrates how projections onto various ones of the component vector axes can be used to identify product units of interest. FIG. 10A illustrates the projection onto an axis represented by the first component vector PC1. We see how the vector AL(i) of each product unit in the multidimensional space is reduced a single-dimensional value, namely the coefficient c(PC1). Comparing roughly with the distributions seen in three dimensions in FIG. 9, the clusters 900 to 904 are recognizable, as well as the outlier 906. Applying a statistical threshold to this distribution allows outliers such as point 906 to be identified. For example, 910 in the drawing indicates a Gaussian distribution curve that has been fitted to the data, with its mean centered on the mean value of the coefficient c(PC1). Statistical significance thresholds can be established, as indicated at 912, 914. Point 906 and point 916 lie outside these thresholds, and are identified as being of interest.

Points identified as being of interest will be distinguished by their black color in this drawing and the following drawings, in contrast to the open circles used for other points. The open and closed circles used herein are merely to present a very simple example, and one that is compatible with the requirements of patent drawings. In a user interface of PCA apparatus 250 and RCA apparatus 252 in a practical embodiment, similar markings, and also flags, color coding, different shapes and the like can be used to distinguish many different subsets of the wafers. While for the present description we assume that each plotted point represents an individual product unit (such as a semiconductor wafer), the apparatus may also allow data from multiple product units to be aggregated and plotted as a single point. As an example, data for wafers in each lot (production batch) can be averaged and plotted as a single point representing the lot. This may facilitate visualization and analysis of lot-to-lot variations, on occasions where the plotting of all individual product units would be too cluttered. The user interface of the apparatus can provide simple controls for the user to switch on or off different types of aggregation. Aggregation can in principle be performed prior to performing the multivariate analysis, but this would be at the expense of "burying" information relating to individual outlying product units.

Figure 10B:
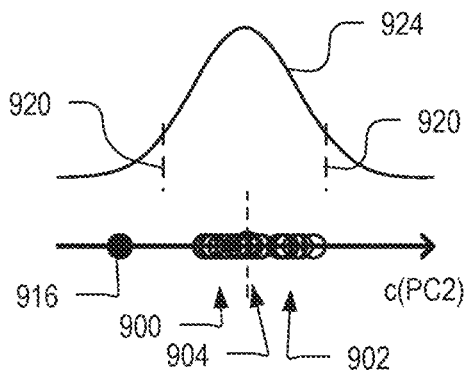

FIG. 10B shows similarly the distribution of the same population of points when projected onto a second axis defined by the second component vector PC2, identified by the multivariate analysis. In this view, the clusters 900-904, as well as outlier 906 all lie in a central region, inside the thresholds 920, 922 defined by the fitted Gaussian curve 924. The point 916 lies outside the thresholds, and is therefore flagged as being of interest. On this projection, however, point 906 does not lie outside the thresholds. It may be flagged as being of interest manually, or by transferring the designation "of interest" from another step in the analysis, but it will not be flagged automatically by the statistical analysis on component vector PC2, illustrated in FIG. 10B. It will be understood that such statistical calculations can be automated within the PCA apparatus 250 and/or RCA apparatus 252, while a degree of manual selection/de-selection can also be provided for. The thresholds and distribution curves used to identify points of interest can be user-configurable. For example, values of sigma, 3-sigma, 6-sigma, etc. can be used.

Figure 10C:
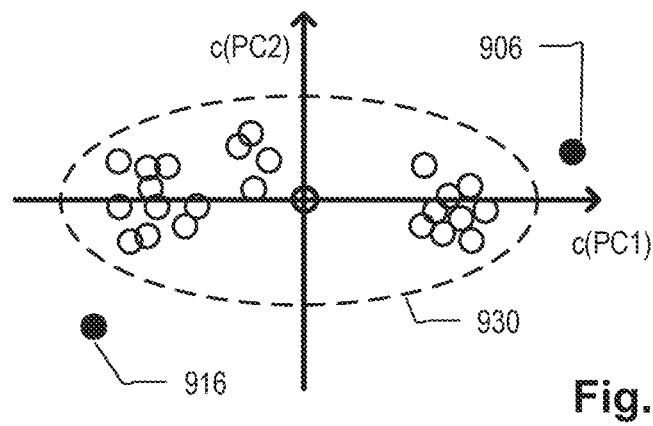

In FIG. 10C, additional information can be obtained by plotting the product units against two or more of the identified component vectors. In this illustration, a 2-dimensional plot is shown, with axes corresponding to the coefficients of component vectors PC1 and PC2, that were illustrated in FIGS. 10A and 10B. This illustration, which may correspond to a printed or displayed report of the apparatus 250, effectively projects all the points in the multidimensional space onto a plane defined by the two component vectors PC1, PC2. Similarly, for 3D visualization, projection may be performed into a 3-dimensional space defined by three component vectors. A user interface may provide a 3D display for this. Whether the number of dimensions is two, three, four or more, this projection may be regarded as projection onto a plane or hyperplane that is a small subset of the many dimensions in the multidimensional space. Looking at the 2-D plot in FIG. 10C, the apparatus applies automated statistical techniques, and/or facilitates use of manual observation and selection, to define a threshold 930, outside which points will be considered points of interest for investigation. Compared with the 1-dimensional views seen at FIGS. 10A and 10B, it can be seen that outliers 906 and 916 are more readily identified than in the 1D plots.

Figure 11A:
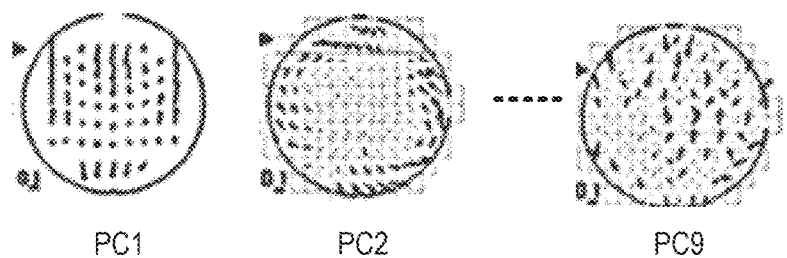
FIG. 11A illustrates example "fingerprints" represented by component vectors identified in the multivariate analysis and FIG. 11B illustrates the projection of object data onto various two-dimensional spaces defined by pairs of component vectors, such as may be displayed by the first or second diagnostic apparatus in an embodiment of the invention.
Figure 11B:
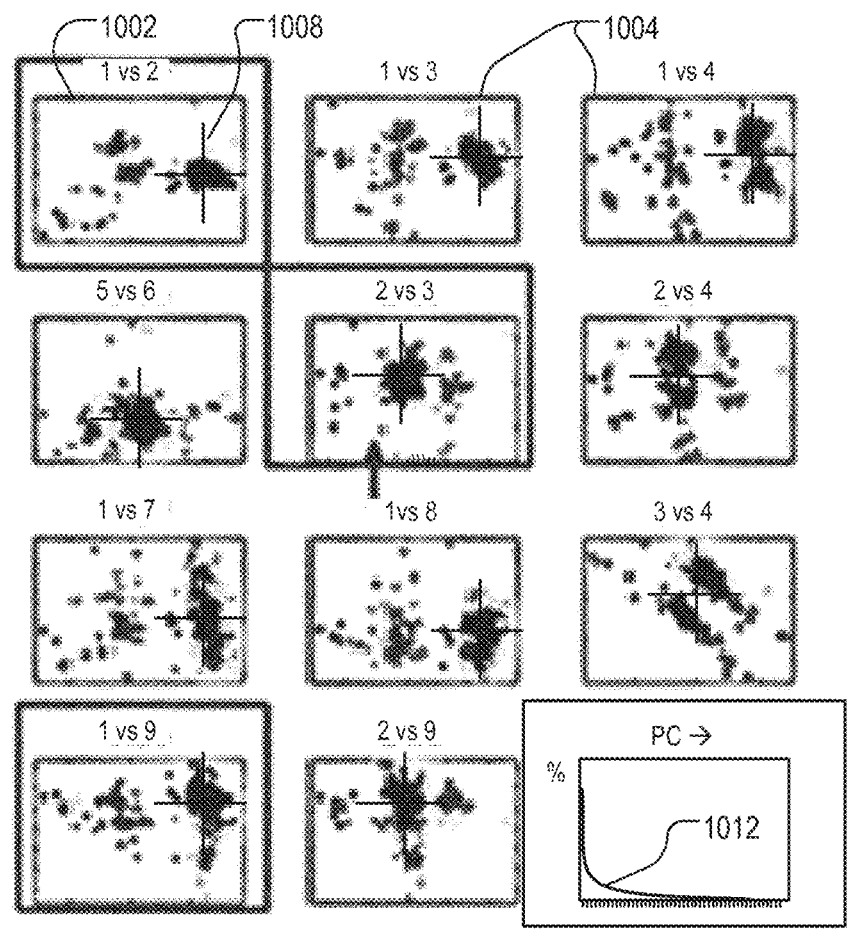

FIG. 11A illustrates examples of component vectors numbers 1, 2 and 9 identified in a real analysis example from a semiconductor production facility. The first component vector PC1 is recognizable as a "bow" fingerprint, which an expert may recognize as potentially related to distortions induced by an epitaxy process step. The second component vector PC2 is a "swirl" component of the type mentioned already and characteristic of an annealing step. The ninth component vector PC9 is a "machine" fingerprint characteristic SUSD effects in the litho tool. These fingerprints can be displayed by the PCA apparatus as an aid in diagnosis. As shown in FIG. 11B, other displays/reports can be produced which plot 2-D projections of the object data onto selected pairs of axes corresponding to respective ones of the component vectors. Thus for example the top left plot 1002 shows the distribution of wafers by their coefficient for PC1 against coefficient PC2 (labeled "1 vs 2"). Other plots 1004 present plots 1 vs 3, 1 vs 4 and so forth as labeled. These may be displayed by the apparatus sequentially or in parallel. In each plot, the origin of the distribution is not necessarily at the center. Crossed axes 1008 have been added to show the origin.

The pairs of values plotted may be selected by a user, and/or may be selected automatically by the apparatus based on observed correlation between component vectors, for example. Labels may be assigned according to recognition of reference fingerprints in the library data stored at 268. The pairs of values plotted may be guided by hints in the library data. For example "when reference fingerprint A is recognized, look for correlation with reference fingerprint B". Note that, after the multivariate analysis is done, the vectors can be projected onto any vector, not only the identified component vectors.

Not shown in this drawing, but important in a practical embodiment, is that the samples are plotted again with identifying information, for example by colors and/or symbols, so that different lots or other different wafers of interest can be distinguished in their various clusters, and/or outlier positions. Wafers that are outliers in one plot can be flagged by color or symbols, so as to reveal their distribution in another plot. In this way, correlations between the different component vectors can be seen.

At bottom right in FIG. 11B a curve 1012 is displayed plots the percentage contribution of the distribution that is represented in the various component vectors. As the decaying curve 1012 shows, most of the information characterizing the distribution is concentrated in the first few component vectors, while the contribution due to each further component vector is ever decreasing. Note that all the information obtained and displayed can be is obtained from the measured object data, and no reliance need be made on context data (other than the identity of the wafers represented). At the same time, the use of context information, such as chuck and/or layer ID may be used, if available. Moreover, the component vectors that are selected as significant emerge from the data through the analysis, rather than being predetermined fingerprints (swirl, bow, sombrero etc.) that have been entered as component vectors to be looked for. Therefore investigations will not be "blinkered" by limiting the search to expected effects and sources. Furthermore, the analysis can reveal fingerprints that in the measurements themselves would otherwise be hidden by much larger contributions. These component vectors may not contribute so much to the positional deviations of individual alignment marks, but they may be of such a nature that they are not corrected in the alignment model, and consequently contribute disproportionately to a product performance parameter such as overlay or CD. Referring to the example of FIG. 11, for example, the SUSD fingerprint represented by component vector PC9 may be revealed only because the multivariate analysis effectively subtracts the emergent component vectors one by one to reveal each next-most-significant component vector in turn.

While the PCA analysis results can be used as an input to automated or semi-automated root cause analysis, as described below, the results can be used in various ways without attributing causes to them. For example, having established the distribution of a population of product units in the low-dimensional spaces represented by for example the 2-D plots in FIG. 11B, an automatic mechanism can be applied to compare object data from new product units with the known distributions, to identify outliers as soon as they are produced. This will be referred to as "excursion detection". A lot can be identified as an outlier lot, if it contains wafers outside the statistical thresholds. Lot-to-lot correctable error may be identified as a result. Also lots can sometimes share certain processing history which makes it easier to trace back the origin of the outliers. But the analysis can also be done per wafer, and then the lot behavior can be checked by giving wafers from the same lot the same symbol. Many aids such as use of different colors and symbols can be used in a practical apparatus, that cannot be represented in the black-and-white patent drawings at the scale seen here. Also as indicated, plots can be highlighted (either manually or automatically) as being significant for interpretation. The plots 1 vs 2, 2 vs 3 and 1 vs 9 are highlighted in the illustrated example.

As mentioned, the known PCA technique is not the only one that may be used to decompose the multidimensional distribution into a few significant, or "interesting" component vectors. For example, instead of seeking each first vector that best describes the distribution, one could program the apparatus to seek a vector such that the distribution of points when projected onto an axis defined by the vector is maximally non-Gaussian (ICA). Such an approach can be expected more strongly to separate different clusters, and to highlight for subsequent analysis contributions that are systematic to one or more parts of the industrial process, rather than merely than variations of noise. A projection that maximizes class/cluster separability can be the objective of the decomposition, for example by performing a Fisher mapping. A Fisher mapping is a "supervised" multivariate analysis, using some of the context data stored at 264 (dotted arrow in FIG. 2). Such context data might be for example chuck identification (the analysis then being performed to maximize information on the influence of chuck-to-chuck variations), or data identifying an individual etching apparatus. PCA and ICA can be performed as "unsupervised" methods meaning that they do not require context data.

Figure 12:
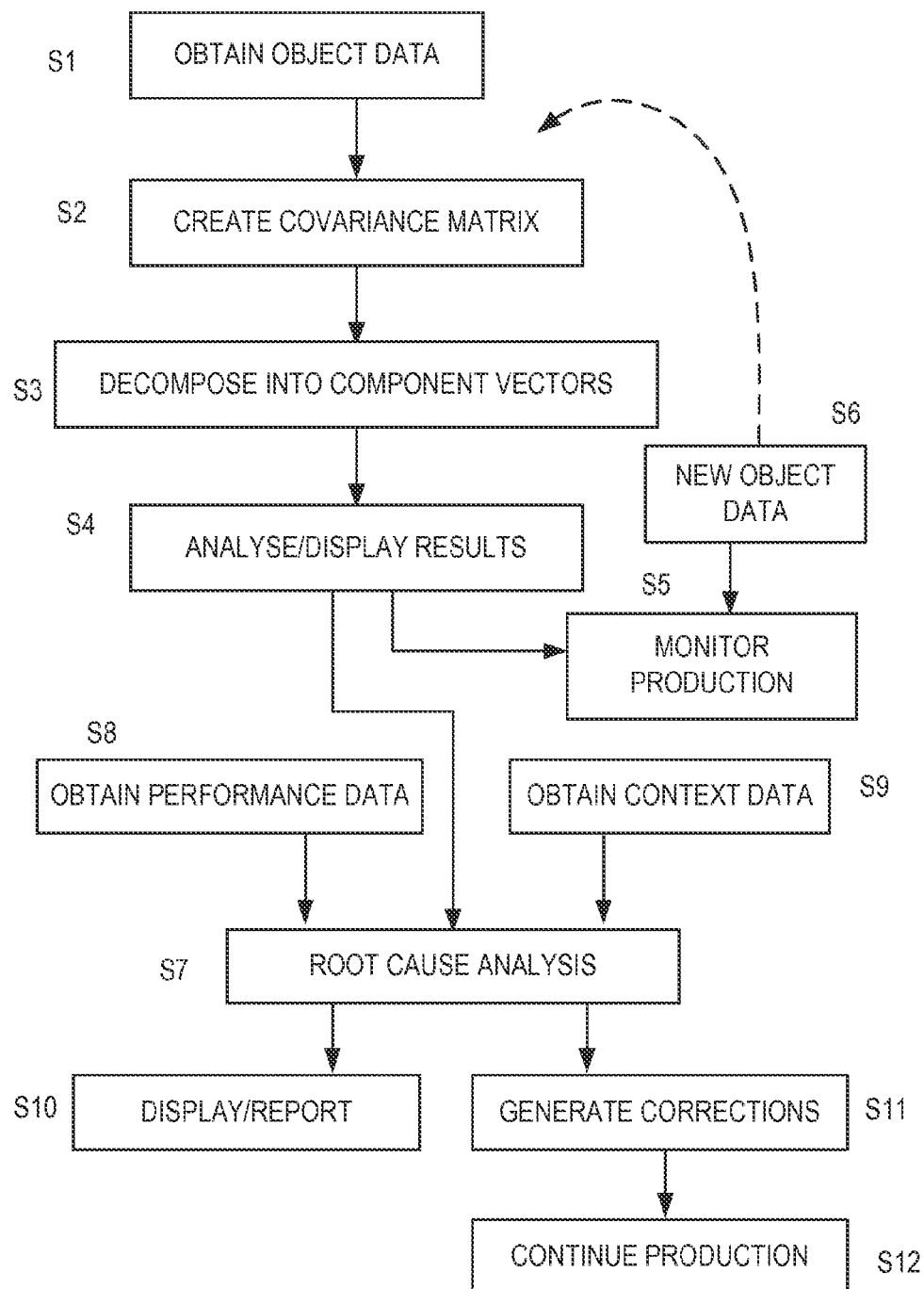
FIG. 12 is a flow chart summarizing steps in the operation of the first and second diagnostic apparatus in an embodiment of the invention.

FIG. 12 summarizes in flowchart form the operations performed by PCA apparatus 250, as described above, and RCA apparatus 252, to be described in more detail further below. In a step S1, object data for a population of product units (in the example, semiconductor product wafers) is obtained and compiled in a covariance matrix at step S2. At S3 the covariance matrix is processed by multivariate analysis. As described already above, the effect of the multivariate analysis is to decompose the distribution of all the vectors in the object data into a set of component vectors, for example component vectors. In step S4 the set of component vectors is processed together with identification of the different product units, to analyze the distribution in desired ways. Results may be processed and selected for display partly by automatic operation and partly by human operator interaction.

The results of the analysis are used in step S5 to provide automatic excursion detection as production continues. New object data from each product unit or batch (lot) of product units is received at S6 and compared with the distribution in one more of the component vector dimensions to detect product units lying outside the main distribution (outliers). As seen in FIG. 10, this comparison can be in one or more dimensions. Optionally, the new object data can be added to the covariance matrix and used to update the decomposition into component vectors. Upon detection of outliers (excursions), the manufacturing process can be interrupted in a serious case, or an alarm can be raised. Further measurement may be triggered, for example to decide whether certain product units or lot of product units can proceed to a next process step, or needs reworking, or needs to be discarded. Alternatively, these outcomes can be triggered directly on the basis of the component vector analysis.

Second Diagnostic Apparatus

At step S7 in FIG. 12, root cause analysis is performed in RCA apparatus 252. This apparatus combines the results of the decomposition into component vectors with performance data obtained in step S8 and/or context data obtained in step S9. The results of the root cause analysis may be displayed or reported at step S10, or they may be used to generate corrections to process control settings at step S11. At step S12, production continues for new product units (for example semiconductor product wafers), applying the corrections to improve the produced products by reducing one or more of the identified fingerprints.

Not all identified fingerprints can or should be corrected. Defining a fingerprint correction may be regarded as a permanent solution to the issues revealed by the analysis, or it may be that servicing or replacement of a responsible apparatus is required. Correction may be useful as a temporary measure until the responsible processing apparatus can be recalibrated or repaired. If the error is not correctable sufficiently, the apparatus in question may be omitted from processing (or reassigned to less critical operations). In addition, it should be noted that to correct some fingerprints might make a performance parameter such as overlay worse, not better. This is because a fingerprint that remains consistent from layer to layer introduces no overlay error at all, whereas to identify such a fingerprint and attempt to correct it in subsequent layers would introduce overlay. Identification of fingerprints that should not be corrected can be stored and exploited by removing this component vector when calculating the corrections for each product unit.

Furthermore, fingerprints that should be corrected may be present only in some of the product units. Where PCA apparatus 250 and/or RCA apparatus 252 has been used to identify the context in which certain fingerprints arise, corrections may be generated with associated context criteria, so that they may be applied selectively in the processing of further product units, depending on the processing history of those particular product units. Thus, corrections may be applied to a product unit only when the processing history of that unit matches the context criteria associated with that correction. It will be understood that, in a lithographic process, corrections will often be selected and applied on a batch or lot basis, rather than for each individual wafer. Furthermore, it will be understood that corrections may be applied in the lithographic operation, that are designed to correct fingerprints arising from the physical and/or chemical operations to which product units have been subjected. Context criteria can be defined in terms of the information extracted from the results of the multivariate analysis, rather than explicit context data.

Without needing to know in advance what parameters will be of interest, collection of alignment data and or other object data can be performed in the background of the normal manufacturing process. If possible, process context data and other identifying data can be gathered. Some of this data can be collected in an anonymized form, so that confidentiality of a process can be respected, while outsourcing the analysis. Within the overall form of the embodiment described, a number "use cases" can be envisaged for the new apparatus. Example functions for a commercial embodiment include: a "one button push" to show fingerprints (the top 10, say) plus mean fingerprint ("PC0"); automatic suggestion of labels for component vectors or clusters of component vectors (e.g. using data scatter); automatic estimation of the performance impact (for example in nanometers of overlay) of a particular component vector or group of component vectors. A qualitative assessment of overlay impact of a certain alignment component vector can be made from alignment-overlay (performance data) correlation analysis, even if detailed simulations sufficient for a quantitative calculation are not undertaken.

Figure 15:
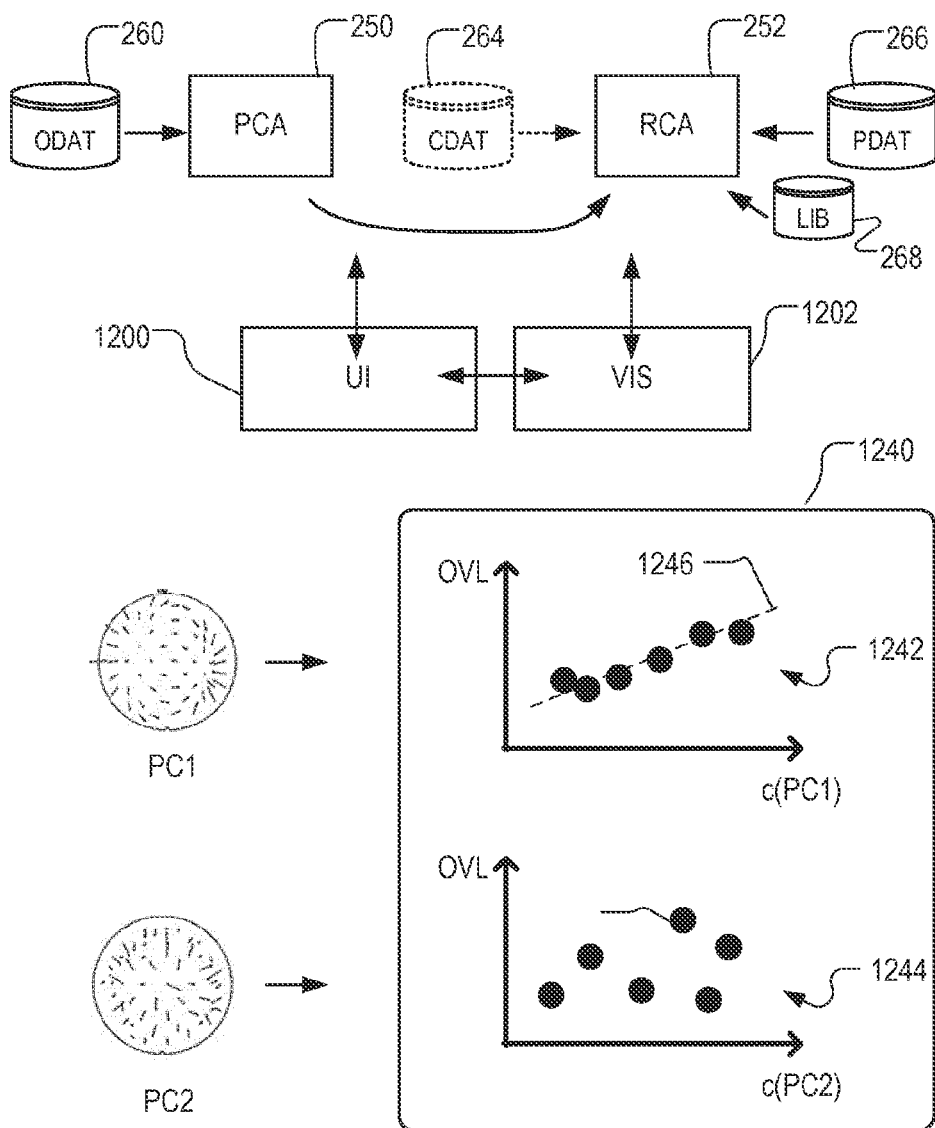

The user interface can provide for an operator to ask for 'relevant fingerprints' and will report a short list of: Outlier wafers and lots; Processing tools co-occurring with outliers. The user interface 1200 and visualizer 1202 can visualize alignment deltas of various types (see below with reference to FIGS. 16 and 17); (color-to-color, step-to-step (layer-to-layer)). It can visualize scatter of the dataset, allow for automatic clustering and visualization of a "mean wafer" (average wafer) per cluster. The co-occurrence of tools and fingerprints can be exploited automatically for example by a Bayesian network or by deriving sets of co-occurrence patterns representing frequently occurring processing tool sets. If performance data such as overlay is also available, the apparatus can correlate this with the component vectors observed in the object data (FIG. 15 below).

In another category of uses, instead of the step S11 of generating corrections as normally understood, the apparatus can generate other data (recipes) for controlling or advising on some aspect of subsequent processing. In a particular example, an "Alignment advisor" can be made, which suggests better operation of the alignment sensors themselves. (see discussion of FIG. 17 below.) A "library" of fingerprints can be accumulated in the storage 268, by which recipes suitable for a particular situation can be retrieved upon observation of fingerprints similar to those observed before.

Further variations and applications include: analysis of overlay as object data, color-to-color analysis of alignment data; observation of intrafield fingerprints rather than (only) the interfield fingerprints illustrated herein; improved "flyer removal".

With regard to color-to-color analysis, for example, it may be noted that alignment sensors AS will typically illuminate the alignment targets with a range of different wavelengths of radiation (colors), to improve the chance of a good position reading through overlying layers. Often an alignment "recipe" will simply select a single the "best" color to use to read marks in a given situation, and other data is discarded. Comparison between signals obtained with different colors can however reveal interesting diagnostic information. In particular, color-to-color differences can indicate the presence of mark asymmetry, where structures within a mark have become distorted by processing. Corrections for subsequent processing steps can then generated differently, depending whether it is judged that a fingerprint represented apparent deviations caused by mark deformation and the measurement process, rather than actual positional deviations of the marks.

Flyer removal refers to the identification of individual marks that are outliers relative to the other marks on the same wafer. The occurrence of such "flyers" can be due to a variety of local factors, which can be easier to recognize using the identified component vectors.

Root Cause Analysis Examples

Expanding now on RCA apparatus 252 and step S5 in the flowchart of FIG. 12, various techniques are available to the operator of the system, for performing analysis to identify the root cause of the fingerprints (component vectors) present in the analyzed product units. Referring back to FIG. 5, it will be recalled that certain fingerprints are recognizably associated with certain processing steps. Thus, if a "swirl" fingerprint PC1 emerges as a contributor in a number of the wafers (and not in others), annealing processes and apparatuses become suspect as causes of the fingerprint. This is the situation illustrated in FIG. 13. Similarly, if a "scaling" fingerprint PC2 is observed to be strong in a number of the wafers, it may be suspected that positional deviations are partly the result of physical distortions introduced by an etch step. In each case, as illustrated, statistical calculations based for example on Gaussian distributions and sigma (standard deviation) values can be employed to distinguish "outlier" wafers 1100 having a lot of swirl from "normal" wafers 1102, and to distinguish outlier wafers 1110 having a strong scaling fingerprint from normal wafers 1112. Note that, although some wafers have a strong positive coefficient and others have a strong negative coefficient, these are both indicative of a strongly expressed fingerprint, only with a different sign. The apparatus in this example will group both positive and negative outliers together as equals. The apparatus can offer a function to group positive and negative outliers separately, if desired.

If the product units in question have reached such a stage in their history that they have undergone several annealing steps and other processing steps, potentially in different apparatuses, the reason why some of them have stronger fingerprints than others may be hard to determine without automated assistance.

As shown in FIG. 12, RCA apparatus 252 in one embodiment uses the determined component vectors (fingerprints) in combination with context data from storage 264 to identify correlations between the strength of the identified fingerprints and certain events, apparatuses, or parameters in the history of the product units represented in the object data. Analysis is performed to identify correlations between (i) the context data 264 representing history of the product units and (ii) the positions of those product units in the multidimensional space represented by the component vectors that have emerged from multivariate analysis of the object data 260. There are many forms this analysis may take, so that RCA apparatus in practice can offer a suite of functions, to be used according to the task at hand. In addition to context data, performance data 266 can be used to find correlations between certain performance parameters (CD, overlay) measured from the product units and the component vectors identified in the multivariate analysis.

In the illustrated example, a network 1120 of co-occurrence relations is established between the occurrence of certain processing apparatus (tools) TL #1, TL #2 and TL #3 in the history of a wafer and the fingerprints PC1 and PC2 in the object data. These three apparatuses may be nominally identical and should perform identically, but the investigation will reveal if one or more of them are causing unwanted effects in practice. In principle, the analysis can be performed "blindly" to seek correlation between any of the identified fingerprints and any or all of the events and apparatuses in the histories of the product units, and for all parameters of the context data. Alternatively, as in the illustrated example, some human or machine expertise can be applied to identify that the observed fingerprints are characteristic of etch and anneal steps, and to seek correlations between the occurrence of the fingerprints and the use of certain tools or tool clusters that may have been used perform those particular steps. In the illustrated example, the analysis reports co-occurrence analysis values representing the percentage of wafers having each tool in their history, that display the fingerprint strongly. This report reveals that among the three tools, 40% (fraction 0.4) of the wafers that have at some point in their history been processed using tool TL #1 have a strong fingerprint PC1 (large coefficient c(PC1)), while the corresponding percentages for tools TI #2 and TL #3 are only 5%.

Thus, tool TL #1 is strongly implicated as a cause of poor performance in the production process. This can trigger further investigation and/or recalibration of the implicated tool. It may also trigger the generation of a history-dependent correction (FIG. 12 step S11). This correction is an addition to the alignment model, that can be applied automatically in subsequent lithographic patterning steps, whenever context data indicates the use of that particular tool or tools in the history of the wafers being processed. Noting that several tools are associated with the same fingerprint PCX, it will also be appreciated that the fingerprint actually added to each wafer by the implicated tools may differ slightly from one another. The fingerprint PCX is however useful as an approximation to those individual fingerprints. Searching through the other component vectors may reveal minor fingerprints and hence more specific corrections that can be assigned to each specific tool, if such accuracy is deemed necessary. In either case, each correction is stored in association with context criteria so that context data for wafers in subsequent steps can be used to determine whether that correction should be applied. Processing of subsequent wafers can therefore be improved, irrespective of whether those wafers have been included in the analysis.

On the other hand, in relation to wafers that are outliers in the distribution of component vector PC2, tool TL #1 is only weakly implicated (co-occurrence analysis value 10%), while tools TL #2 and TL #3 both have higher co-occurrence analysis values (20%, 20%). It will be understood that these results are not conclusive of a fault in a certain tool. Further investigation will generally be required, for example to identify what other factors in the context data can explain why 20% of the wafers processed by tool TL #2 have a strong fingerprint PC2, but 80% do not. However, the automation provided by RCA apparatus using the results of the multivariate analysis is useful in at least focusing attention on the right part of the process. The findings may trigger a correction to be generated, either automatically or with user interaction, as described above with reference to step S11 in FIG. 12.

In the illustrated example, the context data of interest is categorical in nature, and signifies whether a certain processing apparatus (etcher, deposition chamber etc.) or set of tools was involved in the history of processing each wafer. By "categorical" we mean that a given feature or event was either present (one or more times) in the history of a product unit, or was not. Other context data, such as a parameter indicating what temperature setting was used in a particular process step or what strength of correction was applied in a process correction in the litho tool, can be continuous in nature. When it comes to performance data 266, this also can be categorical or continuous in nature. Continuous data can be turned into categorical data if desired. For example, overlay data may be continuous in nature, but wafers can be categorized for example according to which wafers are outliers in the distribution of overlay values, which wafers are not outliers in the distribution of overlay values, or which wafers fall outside some absolute performance specification. The component vectors PC1 etc. can also be treated as continuous variables, or they may be categorized, as in the illustrated example.

Where the context data or performance data it is categorical, co-occurrence relations can be sought in the manner described above by discovering frequently co-occurring sets of categorical items (i.e. tools and outliers). One particular implementation of the co-occurrence relation discovery concerns a particular pre-processing of the available data and a particular type of co-occurrence pattern to be found.

In this scenario, a single database $\mathcal{D}$ is constructed that joins both object data and context data (and/or performance data) for each product unit. Given that the projection of the object data of each product unit is continuous, it is first discretized in order for it to be useful for discovering the considered co-occurrence patterns.

A possible method to discretize the projections is to determine whether each product unit constitutes an outlier with respect to one or more fingerprints, given the distribution of the projections of all product units. This leads to a binary version of the projected object data, stating whether or not this product unit is an outlier given the underlying distributions.

Each row in the resulting database $\mathcal{D}$ consists of the product units' outlier indications of the object data projections and the context data (and/or performance data). A co-occurring pattern c can be defined as a subset of the possible variables in $\mathcal{D}$, and their particular instantiations (e.g. PCA_1=outlier, and Tool_1=Etcher_A).

Each pattern c can be considered as a local model that describes a specific part of $\mathcal{D}$. By selecting a set of patterns c, denoted by $\mathcal{C}$, a model for the complete database $\mathcal{D}$ can be constructed. The choice of model $\mathcal{C}$ depends on a chosen optimization criterion. One instantiation of this criterion is to consider an encoding scheme that assigns each encoder $\mathcal{C}$ a particular encoded database length. In this setting, the best encoder is the optimal model.

An optimal co-occurrence pattern set $\mathcal{C}$ contains significant (given the chosen optimization criterion) relations between variables in $\mathcal{D}$ (discretized object data, context data, and/or performance data). This set C can be used to make the relation between tools and component vectors apparent.

A probabilistic analysis, for example using a Bayesian network, can be used whether the context data is either categorical or continuous or discrete. In this approach, a network is constructed which represents via 'network parameters' $\theta$ the joint probability that a component vector outlier occurs when a certain processing tool is used. An initial choice for the joint probabilities may be specified by a skilled engineer, or by studying tool-fingerprint occurrences from historic datasets. This initialization specifies a 'prior probability' on tool-fingerprint co-occurrence as a 'prior' on the network parameters $p(\theta)$. In a Bayesian network, observations on occurrence of fingerprints and/or involvement of processing tools from new product units can be entered as 'evidence' (data) D in the network. The likelihood $p(D|\theta)$ of the observations given the current network parameters is computed and combined with the prior $p(\theta)$ into a posterior probability $p(\theta|D)$ on the network parameters given the data. This can be done using Bayes' rule of inference:

$$p(\theta \mid D) = \frac{p(D \mid \theta) \cdot p(\theta)}{p(D)}$$

Postulation of conditional independencies between variables (occurrence of certain tools and fingerprints) may be used to make computation of posterior parameter probabilities ('Bayesian inference') tractable, or one may rely on computing the parameter setting $\theta^*$ that maximizes the a posteriori probability, $$\theta^*_{MAP} = \mathrm{argmax}_\theta P(\theta|D).$$

In the case where a flat prior is assumed (i.e. without prior knowledge on the probability of joint tool-fingerprint occurrence), this last expression reduces to the maximum likelihood estimate:

$$\theta^*_{ML} = \mathrm{argmax}_\theta P(D|\theta).$$

By this mechanism, spatial measurement data and/or context data from newly incoming product units can be used to update the probability of co-occurrence for the particular use case and fully customize when sufficient data arrives. Note that observation of either spatial measurement data or context data (or both) for new product units is allowed, since probabilities on any of the missing (non-observed) variables may be inferred via aforementioned Bayes' rule of inference.

The results of the probabilistic analysis can be used to make inferences about causes and effects. The type and complexity of the analysis is a matter of design choice. The methods described above are only examples. From experimental use of the present apparatus, for example, instances have been observed where the presence of a fingerprint of interest is correlated most strongly not with the occurrence of any one apparatus or processing operation alone, but with the occurrence of a particular sequence of operations or apparatuses. The RCA apparatus can therefore provide functions for identifying such sequences as a parameter in the context data.

Figure 14:
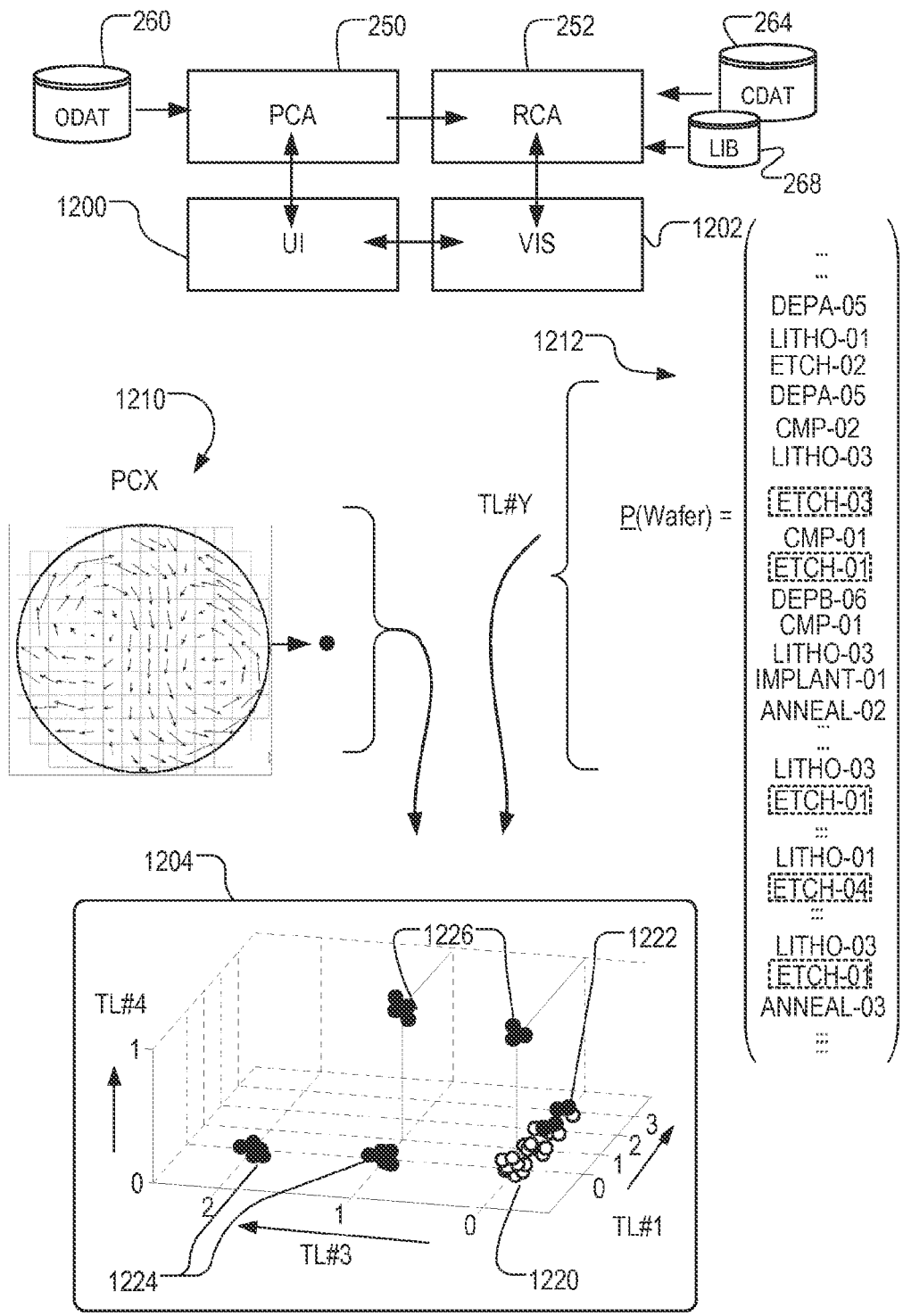

FIG. 14 shows schematically another mode of operation of RCA apparatus 252, in which graphic visualization is used to allow correlations to be observed by a human operator. At the top of the diagram, it is shown how the PCA apparatus 250 and RCA apparatus 252 share common user interface 1200 and visualization module 1202, which may be implemented by conventional computer input devices and display screens. At the bottom of FIG. 14 is shown an example of a display 1204 produced by visualization module 1202. This display provides a particular projection of the object data decomposed into component vectors PC1, PC2 etc., plotted together with the context data representing (in this example) the involvement of certain tools in the processing history.

At 1210 there is illustrated a "swirl" component vector PCX that has been identified as being of interest among the component vectors PC1 etc. identified by PCA apparatus 250. At 1212 there is shown an extract from a process sequence that may be represented in the context data as a vector P(wafer). Each element in the vector represents a step in the history of the wafer, including not only the type of step performed but also the individual tool or tool cluster used to perform that step. The context data for example illustrates whether a tool TL #Y was used. The level of detail provided in the context data is arbitrary and will depend on what can be obtained in a given situation. The use of the object data in the multivariate analysis allows the fingerprints to be identified independently of any context data, and then used in combination with such context data as is available.

The display 1204 is a representation of wafers plotted at points in a three dimensional space defined by the occurrence of three particular tools in the processing history, these being tools TL #1, TL #3 and TL #4. This may be for example a next step in a root cause analysis procedure, following the identification of these particular tools as suspects through the co-occurrence analysis illustrated in FIG. 13. Tools may alternatively be identified as suspects by deriving sets of co-occurrence patterns representing frequently occurring processing tool sets. In the processing of wafers, each wafer may visit a tool more than once, and the wafers are plotted in the three-dimensional space according to how many times they have visited a given tool (0, 1, 2, 3 times etc.). Wafers having a strong fingerprint (large coefficient c(PCX)) are highlighted by solid dots in the plot, while wafers not having this fingerprint are white (open) dots.

This plot reveals a great deal about the influence of each tool on the fingerprint PCX. The wafers that have no involvement of any of the suspect tools TL #1, TL #3, TL #4 are plotted at 1220. As can be seen, these are all represented by white dots and do not have the strong fingerprint PCX. On the TL #1 axis, one can see a few wafers having a strong fingerprint if they have been processed two or more times by tool TL #1 (1222). On the TL #3 axis, we see that any wafer that has been processed once or twice by tool TL #3 is showing a strong fingerprint PCX (1224). On the TL #4 axis (vertical direction as plotted), some wafers have been processed once by tool TL #4 (with or without also being processed by the other tools) and these all have the fingerprint PCX (1226). From this visualization, the RCA apparatus reveals that tool TL #1, though used in the processing of some wafers that show the strong fingerprint, is not the cause of that fingerprint in most cases. Rather the tools TL #3 and TL #4 are more likely to be the cause. At the same time, the fingerprint does seem to be introduced by repeated use of the tool TL #1, as well.

While in the example just described, graphic visualization is used to allow correlations to be observed by a human operator, the actions of the human operator in spotting patterns of correlations and clustering can be automated if desired.

The findings may trigger a correction to be generated, either automatically or with user interaction, as described above with reference to step S11 in FIG. 12 and FIG. 13.

FIG. 15 illustrates another mode of operation of RCA apparatus 252, this time correlating performance data 264 with the results of the multivariate analysis performed on the object data by PCA apparatus 250. The same user interface 1200 and visualization module 1202 can be employed. The performance data in the illustrated example is overlay data measured on the wafers after certain processing steps. The measurements can be taken for example using the metrology apparatus 240 of FIG. 2.

It will be seen that in this case the performance data is continuous-valued, rather than categorical data. Display 1240 presents graphs 1242, 1244 plotting wafers (all represented by solid dots) against axes of overlay (OVL) (vertical axis) and strength of fingerprint PC1 (horizontal axis, graph 1242) and fingerprint PC2 (horizontal axis, graph 1244). In graph 1242 it can be seen by inspection that there is a strong correlation between the performance in terms of overlay and the strength of the fingerprint PC1, while graph 1244 shows no correlation. This allows the operator immediately to identify which of the component vectors is associated with observed performance problems. In particular, it may be that an apparently strong fingerprint has no bad influence on performance, while a relatively weaker fingerprint has a strongly adverse influence. This can be for example because the stronger fingerprint is reliably corrected in the alignment model (FIG. 6), or contributes equally in each layer therefore having no influence on overlay. With the RCA apparatus providing this insight, root cause analysis becomes a very much easier process.

The findings may trigger a correction to be generated, either automatically or with user interaction, as described above with reference to step S11 in FIG. 12 and FIG. 13.

Aside from the visualization for interpretation by a human operator, a statistical analysis such as linear regression (line-fitting) can be performed to quantify the degree of correlation (correlation coefficient) between performance data ad component vectors (fingerprints). The result of this analysis is illustrated on graph 1242 by a best-fit line 1246. Since correlation can be quantified in this way, the identification of implicated fingerprints can be automated. The visualization as such is therefore an optional part of the root cause analysis. Note that overlay, CD and other "performance" parameters, if measured consistently at points spatially distributed across each wafer, can also be used as object data, if desired.

Figure 16:
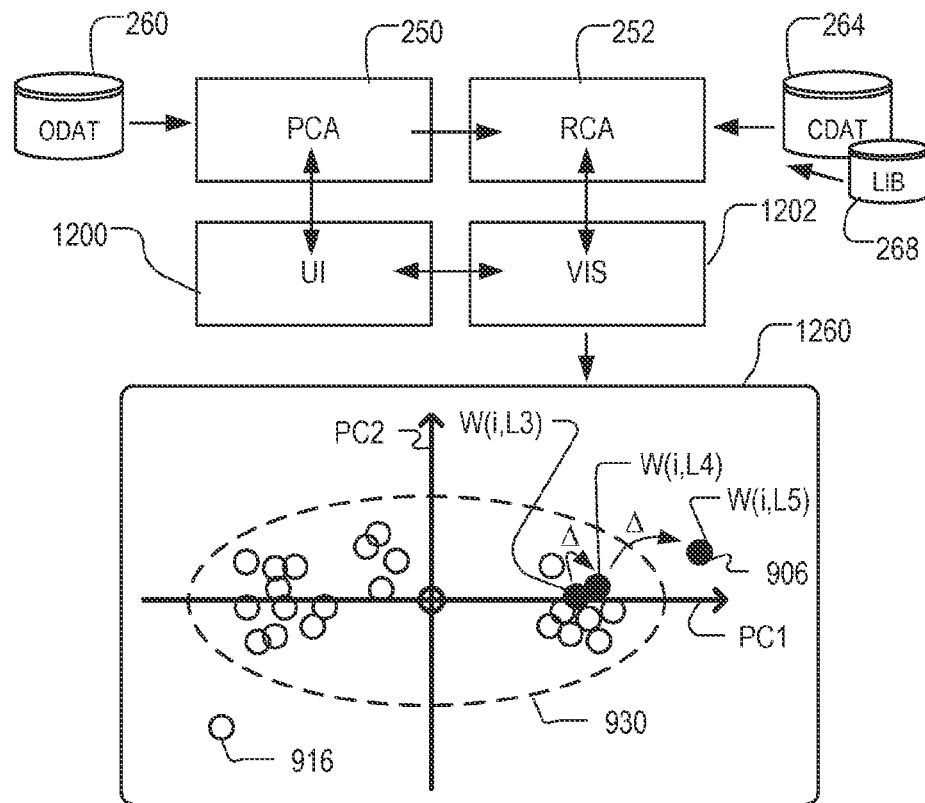

FIG. 16 shows another mode of operation of the RCA apparatus for identifying layer-to-layer variations in the processing of individual wafers. As mentioned above, the object data may include multiple instances of the same product unit, where it has been measured at different stages in processing. The context data 264 includes information connecting these instances, so that the development of the fingerprints in the same product unit can be plotted as a function of its progress through the process. Note that the layer-to-layer relationships could also be in practice contained already as part of the identifying label of each entry in the object data. It is the use of the data in the root cause analysis that makes it considered as context data for the purposes of the present disclosure.

In FIG. 16, visualization module 1202 provides a display 1260 in which wafers are plotted against two of the identified component vectors PC1 and PC2. These two component vectors may have been identified as being of particular interest by a previous step, for example the co-occurrence analysis shown in FIG. 13, or by correlation with performance data as shown in FIG. 15. Alternatively, RCA apparatus may display or analyze many combinations of parameters in turn. It will be recognized that display 1260 shows the same plot as seen in FIG. 10C. As explained in relation to FIG. 10C, the plot and the applied threshold 930 reveal two wafers to be outliers, represented by plotted points 906. Display 1260 allows the history of development of the fingerprints in the corresponding wafers to be revealed. Suppose it is observed that point 906 represents a wafer W(i) at a stage in the process where a layer number 5 is being processed. This can be labeled W(i,L5). The user interface 1200 allows an operator to ask for previous instances of the same wafer to be highlighted in the display. As seen, this highlighting reveals the previous instances W(i,L4) and W(i,L3) among the many hundreds of points plotted. Furthermore, once they have been highlighted, it is obvious to the operator that the fingerprint has been introduced specifically in some processing step after the measurement of the wafer at layer 4 and before measurement at layer 5, that is to say, somewhere in the step 1304. This greatly aids identification of the root cause of the fingerprint. Where the tools used for each layer are the same, it may be found for example that a particular combination or sequence of steps is the cause of distortion being introduced in the step While simple inspection of the display of FIG. 16 reveals very clearly the step change in fingerprints between instances W(i,L4) and W(i,L5), this assumes that the relevant pair of component vectors have been identified. The RCA apparatus 252 in this embodiment includes an automated tool to "mine" the data and reveal the relevant component vectors is desirable. The change in fingerprint coefficients between instances can be referred to as "deltas" (labeled A for illustration in FIG. 16). Deltas can be one-dimensional, with the number of deltas being optionally up to the number of component vectors identified in the multivariate analysis, or they can be multidimensional if required. For example, looking at the two-dimensional plot of FIG. 16, it may be sufficient to identify the step in the strength of component vector PC1, or it may be preferred to identify as delta a (Euclidean) distance in the two-dimensional space defined by the selected component vectors.

By calculating the deltas at each stage in the process, for all component vectors if desired, large step changes (such as the one illustrated in FIG. 16) can be identified automatically and reported. This can be a trigger for use of the other modes of analysis, illustrated in FIGS. 13 to 15, and/or investigation on the tool itself. Especially where a component vector just changes gradually with each implicated process step, it may be that the issue is solved by a correction generated, either automatically or with user interaction, as described above with reference to step S11 in FIG. 12 and FIG. 13.

The interaction between deltas and the multivariate analysis can take many forms. Deltas between the coefficients of the identified component vectors can be calculated and analyzed, as just described. Alternatively or in addition, deltas can be calculated between the measurement data, and then those deltas subjected to multivariate analysis. As a further alternative, deltas can be calculated between the measurement data for product units of interest, and then analyzed in terms of the component vectors identified from the analysis of the object data for the population as a whole. In summary, the diagnostic method may include observing changes between the measurements of a product unit at different stages in the industrial process for one or more same product units, and projecting the measured variation onto one or more of the component vectors identified in the multivariate analysis. This can be useful for verifying the results of the analysis illustrated in FIG. 16. An example will be described with reference to FIG. 17.

Figure 17:
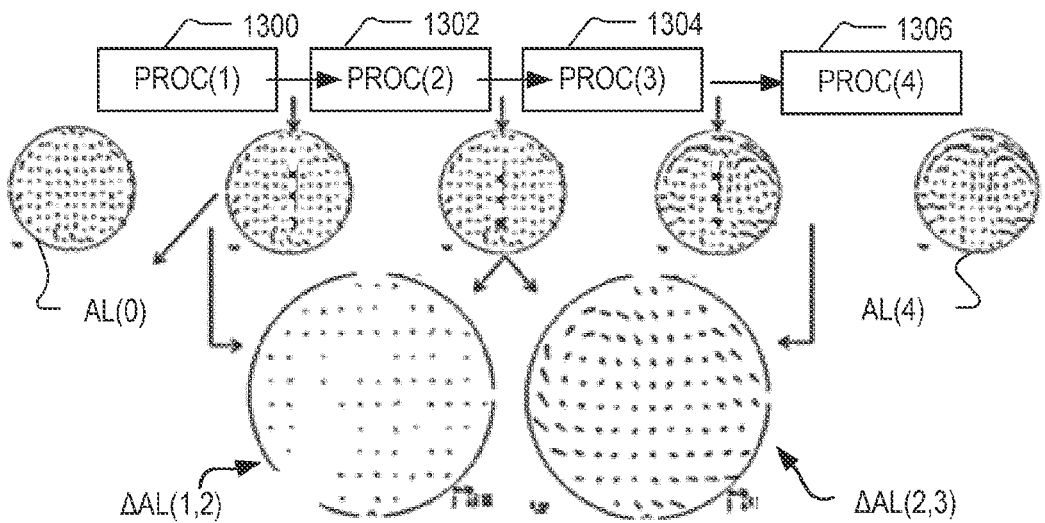

In FIG. 17, different process steps between layers L1, L2 etc. are labeled 1300-1306. The object data AL for a given wafer reveals fingerprint PC1 (for example) which gets stronger from the start (AL0) to the finish of the process (AL4). Suppose the analysis illustrated in FIG. 16 suggests that component vectors PC2 and especially PC1 are showing a step change in step 1304. This result can be verified by calculating and displaying deltas between the alignment measurements (or other object data) as seen at the bottom of FIG. 17. It can be seen immediately that $\Delta AL(1,2)$ representing the change caused by process step 1302 is virtually zero, while $\Delta AL(2,3)$ representing the change caused by process step 1304 has a dominant dual-swirl fingerprint. If this dual swirl fingerprint is the one represented by component vector PC1, then the display tends to confirm that the physical data corresponds to the results of the mathematical analysis performed by the apparatus.

It will be understood that there are many ways the that the types of analysis disclosed herein can be applied to perform a robust root cause analysis. In another scenario, the delta identified by analysis in FIG. 16 might not be the dominant fingerprint in the deltas between measurements. In that case, it could be that there is a flaw in the analysis, or it could be that the fingerprint component vector PC1 highlighted in FIG. 16 is a minor one (in the context of the step 1304), and is masked by the dual swirl fingerprint seen at AL(2,3) in the drawing. The set of component vectors can be used as a "probe" to reveal hidden component vectors in the deltas $\Delta AL(1,2)$ and $\Delta AL(2,3)$ by projecting them onto the component vectors already identified.

Figure 13:
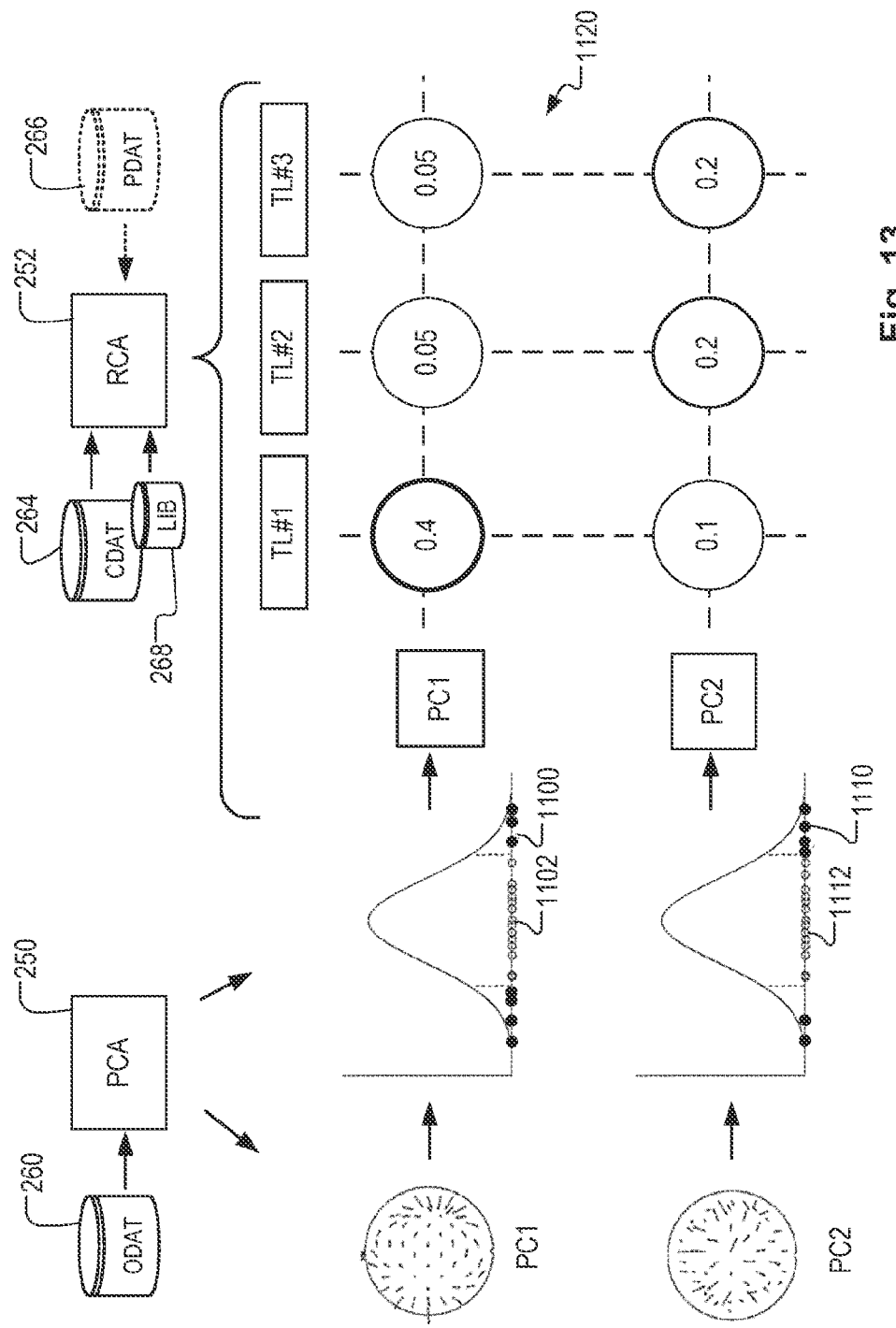
FIGS. 13 to 17 illustrate schematically various mode of operation of the second diagnostic apparatus that may be used independently or in combination for performing root cause analysis in an embodiment of the invention.

While the analysis just described refers to a single wafer (product unit), more robust analysis will be performed in practice, based on statistically significant populations of product units. For example, the behavior of RCA apparatus 252 can be made different in practice if the large delta observed in FIG. 17 occurs in only one wafer of a lot, compared with when it is observed in all wafers undergoing the same process step 1304. If it is found that the large delta occurs in some wafers (or some lots) but not others, this analysis can be combined with the modes shown in FIGS. 13 and 14 to correlate the observance of the delta with the involvement of specific tools in the process. The process is the same as illustrated in FIG. 13 or 14, with the delta in fingerprint strength being used in place of the fingerprint strength itself.

The above example refers to deltas between different instances of the same product unit measured at different stages in an industrial process, that may be referred to as "step-to-step" or "layer-to-layer" deltas, other types of delta may be made, if the object data is available. As a particular example, the object data may include different measurements of the same property, made by different sensors, or the same sensor operating with different parameters. For example, the alignment sensor in a commercial lithographic tool generally provides a number of different operating modes using different colors (wavelengths) of radiation, different polarization, illumination profile and so forth. This is to recognize that different product types, and different layers within the product, contain a wide range of materials and types of marks. In addition to controlling these parameters, an "alignment recipe" will generally specify what subset of the alignment marks are to be measured across the wafer, to save time and improve throughput. No single "recipe" is suitable for measuring every layer on every product. The new apparatus can reveal opportunities for selecting a better recipe, based on observation of the selected recipe in practice, and/or by recognizing certain types of fingerprints that in turn suggest a particular recipe will be favored.

As a simple example of the latter feature, where a "scaling" fingerprint has been identified, the alignment recipe for future steps may be adjusted to include more marks in a peripheral region of the wafer. As another example, it may be that a certain identified fingerprint is known to be indicative of mark deformation, which in turn means that positions reported for these marks will be subject to inaccuracy. Different marks or a different mode of measurement of the marks may be selected that will be less prone to this deformation, so as to improve the accuracy of the positional measurements. Rather than selecting or deselecting a mark completely for the alignment, marks may have their weighting increased or decreased in the calculation of the alignment model.

More generally, then, the novel apparatus can provide a range of "alignment advisor" functions. The apparatus can simulate the residuals that would occur when different alignment models were to be chosen and evaluate their appropriateness by projecting these simulated residuals on the component vectors determined from the initial object data. Using performance data such as overlay data, the apparatus can help identify correlation between high-overlay product units and the component vector scores according to the corresponding alignment object data. Hence, observing similar scores in new product units may be indicative of performance degradation and may be used for timely corrective actions. In addition, object data measurement locations could be optimized in order to better capture the pattern according to certain component vectors (e.g. wafer deformation patterns) and/or suppress the pattern due to other component vectors (e.g. mark deformation patterns). Furthermore, attributing certain component vectors to their origins (e.g. processing tool etch chamber, anneal chamber or perhaps litho tool step-and-scan operation) can be aided by relating the vectors to certain vector patterns known upfront to occur with certain processing functions and may lead to dedicated options (corrective; diagnostic) for further process optimization.

Any or all of these functions can be linked to the fingerprint library stored at 268. Fingerprints found in new wafers can be mapped to those in the library, to retrieve interpretations and recommended recipe changes.

Alternative Implementations

As mentioned already above, alternative implementations are possible without deviating from the principles of the present disclosure. Recall that, in the implementation described above and illustrated in FIGS. 7 to 9, the object data is arranged into vectors to form a covariance matrix for the purposes of PCA in such a way that each vector AL represents measurements of one product unit (e.g. wafer). The elements of that vector are x, y deviations measured from alignment marks at points spatially distributed across the product unit. Consequently, the different dimensions of the multidimensional space are the values of the parameter of interest measured at the different positions on the wafer. The number of dimensions corresponds to the number of measured deviations per wafer, and we can refer to this multidimensional space as "mark space", by reference to the marks from which these deviations are measured. Note that, in those implementations, both the object data obtained by measurements and the component vectors obtained by the multivariate analysis are expressed in the same multidimensional space. As will now be explained, alternative implementations are possible, so that the object data prior to and during the multivariate analysis is not necessarily expressed in the same multidimensional space as the component vectors that are ultimately obtained.

Figure 18:
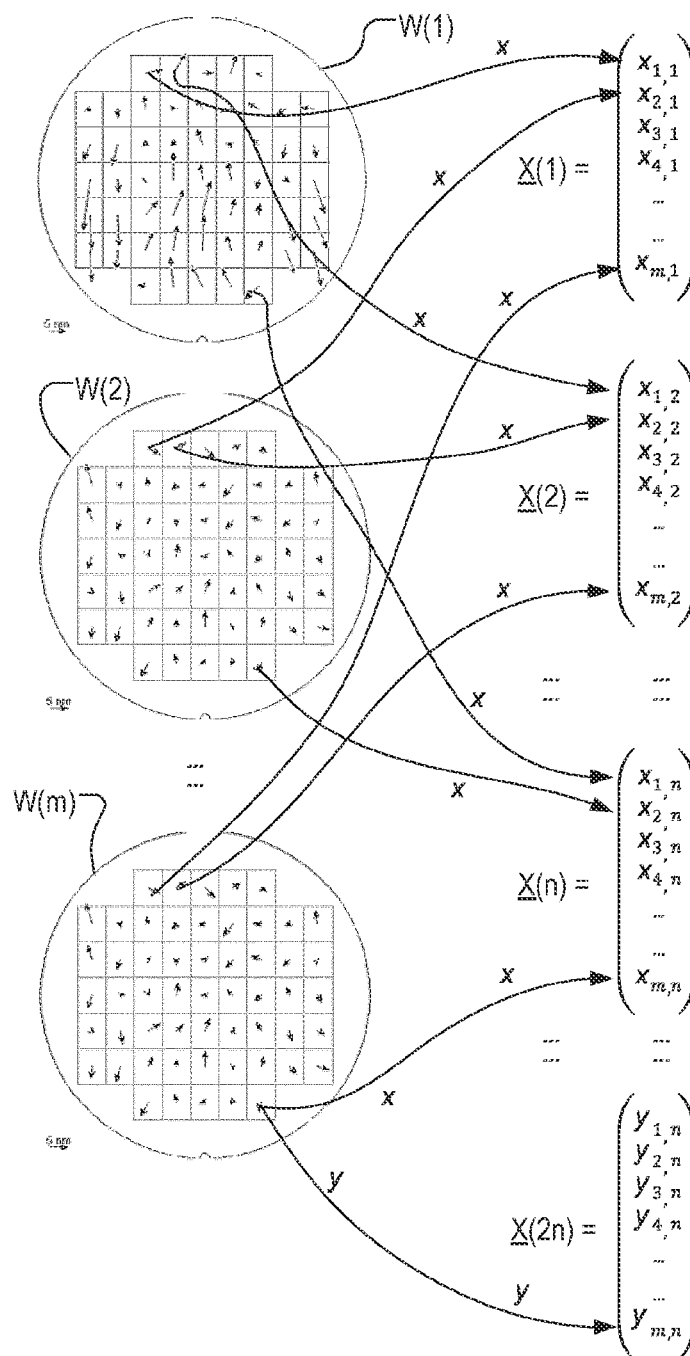
FIG. 18 illustrates the correspondence between the measurements from a set of wafers and the elements of the vectors in an alternative implementation of a multivariate analysis.

FIG. 18 illustrates for example a first alternative implementation which expresses the object data as vectors in a multidimensional space, but it is a different multidimensional space rom that in which the resulting component vectors will be expressed. In each vector represents the parameter of interest measured at one spatial location, over a number of different product units (e.g. wafers). In this alternative implementation, each vector would correspond to one of the measurement points, and each element of the vector represents the measured value of that parameter at that point on a different respective one of the product units. Consequently, the different dimensions of the multidimensional space would be the values of the parameter measured at the that location on the different wafers.

In the example where the parameter of interest is x and y positional deviations measured from alignment marks, then the roles of wafers and marks are interchanged compared with the implementations illustrated in FIGS. 7 to 9. The set of spatial wafer measurements are represented as multiple spatial observations defining 2n vectors X(j) in a space spanned by the set of m wafers. The correspondence between the measurements from a set of wafers and the elements of the vectors is illustrated graphically in FIG. 18. The multidimensional space in which the object data are expressed may be referred to as "wafer space", in contrast to the "mark space" used in the previous examples. Mathematically, this means that a (wafer) covariance matrix $\Sigma_w$ can be expressed as:

$$\Sigma_w = E[X(1-2n)*X(1-2n)T]$$

where X(1–2n) is a matrix expressing the object data as a set of 2n vectors whose elements are the measurements of x or y deviation on m different wafers. This wafer covariance matrix $\Sigma_w$ has dimension m×m where in the earlier implementation the mark covariance matrix $\Sigma$ has dimension 2n×2n.

It will be understood that in these different implementations the same object data is represented, merely in transposed forms. Indeed another representation of the wafer covariance matrix is simply:

$$\Sigma_w = E[AL(1-m)T*AL(1-m)]$$

using the same notation as the (mark) covariance matrix in FIG. 8. In other words PCA other multivariate analysis can be performed using the mark covariance matrix or the wafer covariance matrix $\Sigma_w$. Moreover, it can be shown that, provided the means of the columns and the means of the rows in the object data matrix (AL(1–m) or X(1–2n)) are also zero, the results of the analysis, when expressed as component vectors in the mark space, will be the same. This condition applies in embodiments where the mean vector is subtracted, as illustrated for example in FIG. 9B.

More specifically, consider that the wafer covariance matrix $\Sigma_w$ of dimension m×m is diagonalized in the course of the PCA analysis procedure. When both the mean of the columns and the mean of the rows is subtracted, the normalized component vectors (eigenvectors) and hence any projections of the data onto this basis, are the same as obtained with the first implementation (where the mark covariance matrix is diagonalized). The component vectors obtained by this alternative method can thus be used to extract diagnostic information in the same ways as already described above, and as further described below.

In yet another embodiment of the method, a singular value decomposition (SVD) of the object data is performed as a form of multivariate analysis. In the SVD method the object data is analyzed directly in matrix form, and not explicitly expressed as vectors in any multidimensional space. However, with straightforward manipulations of the results one can again obtain component vectors expressed in a multidimensional space where they can be used to extract diagnostic information as already described above, and as further described below.

We further remark that subtraction of the mean wafer as practiced in our exemplary embodiments is not strictly necessary for a component vector decomposition of spatial measurements on multiple wafers or other product units. When the mean wafer is not subtracted, a dominant component vector may be aligned with the average.

It goes without saying that all of the implementations disclosed herein can be applied to measurements of any parameter at points spatially distributed across any type of product unit. The terms "mark space" and "wafer space" are used purely for illustration, and do not imply that the concepts behind them are limited to the example of alignment marks on semiconductor wafers.

High Resolution Reconstruction of Low Resolution Data Based on Multivariate Analysis Results As detailed above, various manufacturing process disturbances associated with specific fingerprints may affect the manufacturing process. Clearly, it is desirable during 'real time' manufacturing process to rapidly detect process disturbances/or corresponding fingerprints and/or to correct or counteract systematic process disturbances. The process monitoring system mentioned above is for that purpose. It is also desirable to reduce the time and metrology resources dedicated to methods and associated apparatuses for the detection and correction of process disturbances.

Disclosed in this section are a method and associated apparatus for improving the detection of manufacturing process disturbances, enabling systematic correction of manufacturing process disturbances using available manufacturing resources (e.g. stored process data). The method exploits the results of multivariate analysis performed on historic measurements, such as for example the PCA analysis in the embodiment described here.

Dense measurements (i.e. with a high spatial resolution) are regularly carried out in order to monitor process performance and (if necessary) to generate associated corrections for process optimization purposes. However, measurements a with high spatial resolution consume time and resources, so they tend to be made on a few lots only.

Sparse measurements (i.e. with a low spatial resolution) are carried out on each wafer in order to monitor time and sparse spatial measurement variations. Low resolution measurements/data (referred to below as sparse object data) may be collected before exposure, for example at measurement station MEA and/or after exposure, with one or more metrology apparatus 240.

Figure 19:
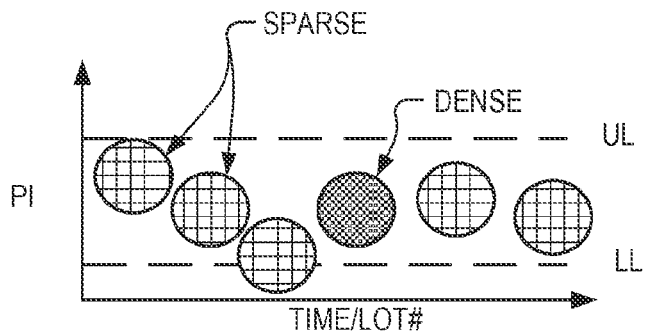
FIG. 19 illustrates the principle of a performance monitoring function in the production facility of FIG. 2.

FIG. 19 presents the principle of a performance monitoring function in the production facility of FIG. 2. The method can be implemented in the context of monitoring step S5 in the method of FIG. 12. The method can be applied using the result of multivariate analysis of measured object data, whether or not other steps such as root cause analysis are also performed using the same or different object data. As shown in FIG. 18, measurements are carried out of a desired process performance indicator PI, to determine whether the manufacturing process drifts outside a control limit CL region delimited by an upper limit (UL) and a lower limit (LL). The measurements in this context may be regarded as performance data, but in the present example they relate to the same parameter as the object data which has been collected and subjected to multivariate analysis. The horizontal axis represents time or, in the context of a mass production process for semiconductor wafers, wafer number or lot number. As mentioned already, some wafers or lots will be measured with a high spatial resolution (referred to hereinafter as dense measurements) while the majority of monitoring measurements will be performed with a low spatial resolution (sparse measurements), to save time.

Figure 20:
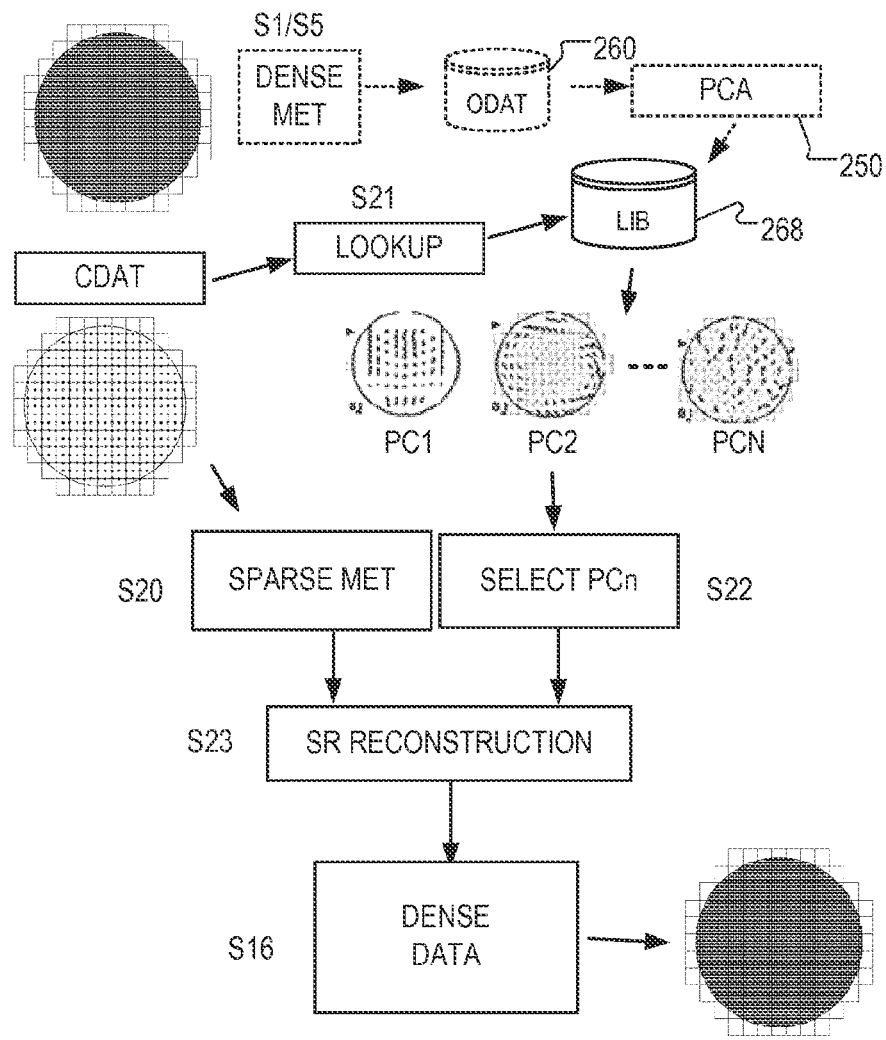
FIG. 20 illustrates use of the component vectors identified in the multivariate analysis for reconstruction of high resolution object data from low resolution measurements in the performance monitoring function, according to another embodiment of the present invention.

Referring now to FIG. 20, we present the principle of a reconstruction method, whereby a multivariate analysis technique such as principal component analysis (PCA) may be applied to enhance the effective spatial resolution of sparse measurements during process performance monitoring. This may be referred to as super-resolution reconstruction of sparse measurements by performing history based spatial interpolation for improving the accuracy of estimated fingerprints for each wafer. It is proposed to reconstruct a given sparse measurement by, for example, linearly combining stored dense component vectors obtained from historical dense measurement data from wafers similar to the present wafers. Note that the example of super-resolution reconstruction presented in this section is PCA based. Other forms of multivariate analysis may also be employed in the reconstruction process.

FIG. 20 presents an example of a PCA based reconstruction method. It is assumed that dense (high spatial resolution) measurements have been made of a number of past wafers, corresponding to a particular layer and product design. In the context of the method of FIG. 12, for example, these measurements are taken in steps S1 and S5. The measurements may be for example a CD measurement, overlay or focus, depending which parameter is desired to serve as performance indicator PI for the process monitoring. PCA apparatus 250 has processed these dense measurements to obtain a set of component vectors or "fingerprints". (The measured parameter is therefore considered object data for the purpose of this analysis, while it has also been used above as an example of "performance data", for RCA apparatus 252. In the context of the present example, it may also be referred to as "monitoring data".) These component vectors are stored in a library at 268. The library potentially also includes fingerprints obtained by PCA on data from different layers and different products. Context data (not illustrated in FIG. 20) identifies which elements in the database are relevant to which layers and products.

Subsequently (for example in the course of monitoring step S5 of FIG. 12) at step S20 a newly patterned wafer is subjected to sparse measurement of the same parameter (for example CD). The component vectors $PC_n$, calculated from the high resolution measurements by PCA apparatus 250, are retrieved from the library at S21, using context data identifying the product and layer to ensure that the relevant component vectors are retrieved.

At step S22, a subset of the dense component vectors (PC1, PC2 . . . PCN) may be selected from those stored in the library. For example, the selected component vectors may correspond only to those with coefficients surpassing those of equivalent pure Gaussian randomness. Otherwise, the results of analysis might be influenced undesirable by what is only noise. Other selection criteria may be applied, for example based on more detailed context data where root cause analysis has been performed by RCA apparatus 252.

At step S23, a given sparse measurement (sparse monitoring data) and the selected high resolution component vectors are used to perform super-resolution reconstruction to generate a dense version of the sparse monitoring data. This is delivered at step S16 for use in process monitoring and/or control. In summary, when a sparse measurement is achieved on a wafer and sparse monitoring data representing this wafer are super-resolution reconstruction can be performed to reconstruct a high resolution version of the sparse data based on stored, available relevant data (component vectors) representing, for example, dense measurements such as measurements obtained for each product and layer.

The super-resolution reconstruction step S23, can be implemented for example by the following steps, starting from a multidimensional vector M representing a given sparse measurement of CD or other monitoring data:

(a) Subsample the selected component vectors ($PC_n$) to mimic the sparse sampling scheme of the received monitoring data M. $(PC_n)_L$ can represent the sparse version of the component vector PCn.

(b) Determine a best fit based on a least squares criterion, in order to find a linear combination of the component vectors that best described the sparse monitoring data. In mathematical terms, the task is to find a weight factor $c_n$ by projecting the measured vector onto the corresponding component vector $(PC_n)_L$.

(c) Sum the original (high density) component vectors ($PC_n$) with the identified weight factors $c_n$ found in step (b) to reconstruct a high resolution version MH of the monitoring data M.

The reconstruction technique applied here is similar to a PCA based image reconstruction technique known to be applied in fields related to computer vision. The known technique is disclosed in 'PCA based Generalized Interpolation for Image Super-Resolution' by C. V. Jiji et al., ICVGIP 2004, Proceedings of the Fourth Indian Conference on Computer Vision, Graphics & Image Processing, Kolkata, India, (2004). Note however that the Jiji reference works entirely with low resolution images. There is no high resolution object data and no library of high resolution component vectors. There is only a library of low resolution "eigen-images", which have been obtained by PCA analysis of a database of historical face images. Other up-sampling (i.e. resolution enhancement) techniques, mainly applied for image acquisition and transmission, are, for example, disclosed in U.S. Patent Documents U.S. Pat. No. 6,184,935, US20110081094, U.S. Pat. Nos. 6,603,804, 7,019,777, and US20070031065. A method and apparatus for the enhancement of images stored in a database are disclosed, for example, in U.S. Pat. No. 7,123,780. Face recognition and reconstruction methods are disclosed, for example, in U.S. Patent Documents U.S. Pat. No. 7,379,611 and US20110305404. The inventors have recognized that teaching from any of these references may be applicable to assist implementation of the reconstruction technique for enhanced metrology, as disclosed here.

It will be understood that the terms "sparse" and "dense" are relative terms, and no absolute level of spatial resolution is implied by either term. Moreover, what is a high spatial resolution in one context may be a low spatial resolution for another purpose or for another type of data.

While the reconstruction method has been described here with an implementation of PCA corresponding to the examples described above with reference to FIGS. 7 to 9, the reconstruction method can also be adapted to use the alternative implementations described above.

Application Example of Reconstruction to Improve Performance Monitoring

Figure 21:
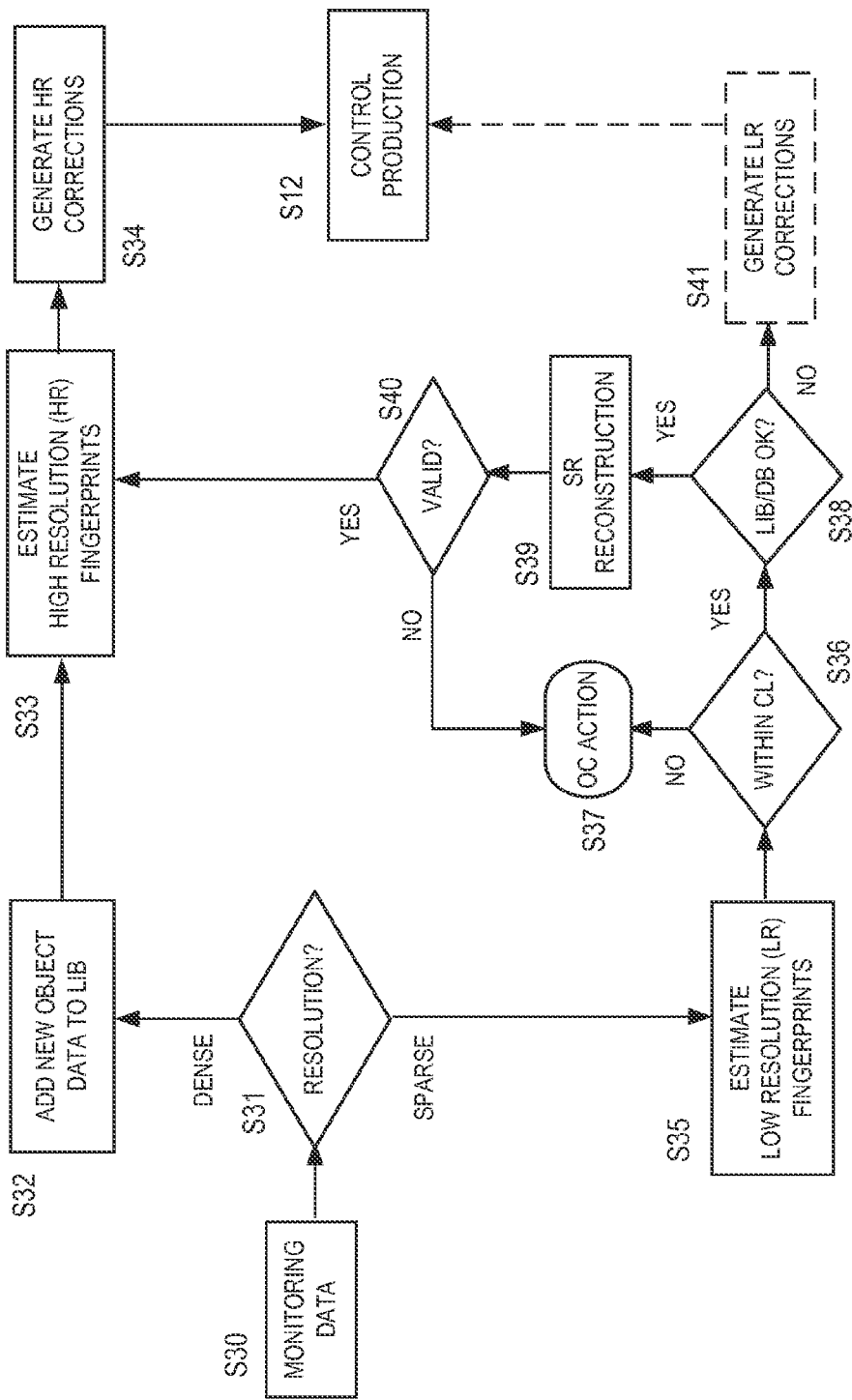
FIG. 21 shows a diagram of a workflow of the performance monitoring function incorporating the reconstruction in the embodiment of FIG. 20.

FIG. 21 is a diagram of a workflow representing a performance monitoring function comprising a super-resolution method of the type illustrated above. The performance monitoring function may be implemented in a controller for, for example, real time process corrections and/or data pre/post-processing in a manufacturing facility such as that shown in FIG. 2. This may be an implementation for example of monitoring step S5 of FIG. 12 and may feed into correction step S11 or a separate correction step.

At step S30, measurements forming monitoring data become available. The spatial resolution of the monitoring data is monitored at step S31. If the data is obtained by dense measurements, then at step S32 it may be added as object data to the library stored at 268 (S6 in FIG. 12). The PCA analysis may be updated, either immediately or on an occasional basis. At step S33, high resolution fingerprints of the monitored wafer or lot are estimated in the same manner as the normal performance monitoring process. For example, spatial and/or temporal smoothing may be applied to reduce noise in the measurements. At S34, corresponding corrections are delivered and made available to the controller to improve performance of subsequent production (S12 of FIG. 2 corresponds).

If the new monitoring data is obtained only by sparse measurements, sparse fingerprints are estimated at step S35. Again, this may involve spatial and/or temporal smoothing to reduce the influence of random noise in the measurements. At step S36, process indicator PI is tested against control limits as described in FIG. 18. If the performance indicator is outside the control limit CL, flow proceeds to an out-of-control action step S37. Depending on design and on the severity of the errors, the production process may be is stopped, or at least an alarm may be sent to the controller. If the performance indicator is within limits, then at step S38 it is checked whether relevant PCA results are available in the library at 268. If suitable results are available, then at step S39 a super-resolution reconstruction applied to the sparse monitoring data. This is performed as described above with reference to FIG. 18. After reconstruction, a high-resolution (dense) version of the monitoring data can be delivered to step S33 for use in performance monitoring and correction. Before passing to step S33, however, the reconstruction is quality-checked at step S40. If the data reconstruction process of step S39 is judged unsuccessful for some reason, the control again passes to step S37 to trigger an out-of-control action. Back at step S38, in case of insufficient PCA results available in the library, the performance monitoring function may optionally at S41 generate low resolution corrections that can be delivered to the controller.

Assuming libraries of sufficient size and quality are accessible to the performance monitoring function, the reconstruction method just described can bridge a gap between sparse and dense measurements in a high-volume manufacturing process. With regard to the quality check at S40, it may be for example that the least squares fitting of component vectors yields only a poor correlation with the received monitoring data. This indicates that some effect is present in the monitored wafers, that has not been seen in the historic object data used in the PCA analysis represented in the library. In this way, monitoring process may be able to send out alarms when current measurements become significantly dissimilar from past observations, for instance, if the variance of component vectors fit residuals surpasses a specific threshold for a given application. Note that this quality check can give an early indication of trouble, even though the performance indicator itself is still well within the control limits.

In conclusion, outputs of the super-resolution reconstruction method may yield several benefits:

The SR reconstruction method provides reliable high resolution corrections that can be applied to each lot, thus improving yield for critical layers.

- Metrology effort can be reduced for sub-critical layers with little performance loss, thus permitting more extensive higher resolution measurements for critical processes.
- Performance variation can be detected at an early stage, thus saving on rework expenditure and allowing for better planning of dense measurements.

Alternative and/or additional application examples of the super-resolution reconstruction (SR) method are, for example, the detection of subtle process drift (e.g. fingerprint variation over time). The fingerprint variation is currently monitored by performance indicators that monitor the variation magnitude, but not the variation spatial profile. Therefore, small process drifts may be undetected until reaching a 'critical point' that may affect the manufacturing process. SR method may be implemented to detect small time variation of fingerprints spatial profile.

Alternatively, the SR method, in parallel with sparse measurement, may be employed for the monitoring of 'relatively stable' sub-critical layers to reduce the frequency of performing high-resolution measurements. In this case, gradual changes of high spatial frequency may be undetected.

The SR method may also help to improve yield. For example, in case of critical layers presenting a high spatial frequency fingerprint that varies over time, it is preferable to measure each lot densely; however, as already mentioned, extensive measurements are not feasible in practice. Using super-resolution reconstruction of dense measurements from sparse measurements allows updates to the processing sub-recipe to be implemented with a reduced time lag, because it is not necessary to wait until the next high-resolution measurement is made.

The SR method can be applied to measurements other than performance parameters such as CD and overlay. Leveling and/or alignment procedures within the lithographic patterning step may also benefit from the implementation of the SR method within their computational apparatuses and associated processes. For example, during leveling and/or alignment procedures, SR method may help in enhancing the spatial resolution and/or increasing the accuracy of height map and/or level measurements based on 'history' data. Reducing the density of actual measurements can help increase throughput.

The SR method may also help in reducing the amount of scanning electron microscope (SEM) measurements needed for the calibration of full chip numerical simulations to SEM measurements. For example, SEM measurements may be carried out for a few layers. The SR method can then be applied to sparse measurements, to limit metrology expenditure for subsequent jobs.

Hardware Implementation

Figure 22:
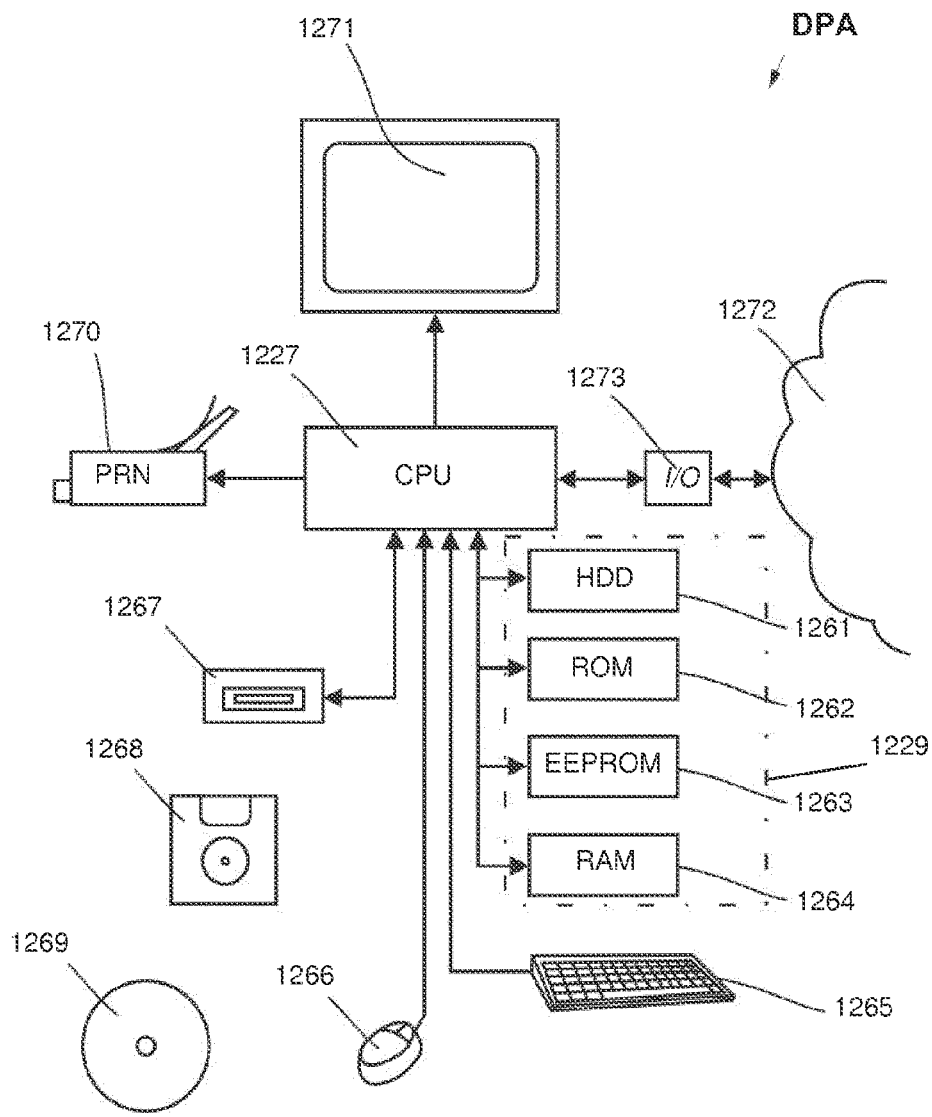
FIG. 22 illustrates schematically data processing hardware programmable to implement the first and/or second diagnostic apparatuses of the embodiments of the invention.

The steps of the methods described above can be automated within any general purpose data processing hardware (computer), so long as it has access to the object data and, if desired performance data and context data. The apparatus may be integrated with existing processors such as the lithography apparatus control unit LACU shown in FIG. 1 or an overall process control system. The hardware can be remote from the processing apparatus, even being located in a different country. Components of a suitable data processing apparatus (DPA) are shown in FIG. 22. The apparatus may be arranged for loading a computer program product comprising computer executable code. This may enable the computer assembly, when the computer program product is downloaded, to implement the functions of the PCA apparatus and/or RCA apparatus as described above.

Memory 1229 connected to processor 1227 may comprise a number of memory components like a hard disk 1261, Read Only Memory (ROM) 1262, Electrically Erasable Programmable Read Only Memory (EEPROM) 1263 or Random Access Memory (RAM) 1264. Not all aforementioned memory components need to be present. Furthermore, it is not essential that aforementioned memory components are physically in close proximity to the processor 1227 or to each other. They may be located at a distance away The processor 1227 may also be connected to some kind of user interface, for instance a keyboard 1265 or a mouse 1266. A touch screen, track ball, speech converter or other interfaces that are known to persons skilled in the art may also be used.

The processor 1227 may be connected to a reading unit 1267, which is arranged to read data, e.g. in the form of computer executable code, from and under some circumstances store data on a data carrier, like a floppy disc 1268 or a CDROM 1269. Also DVD's or other data carriers known to persons skilled in the art may be used.

The processor 1227 may also be connected to a printer 1270 to print out output data on paper as well as to a display 1271, for instance a monitor or LCD (Liquid Crystal Display), of any other type of display known to a person skilled in the art.

The processor 1227 may be connected to a communications network 1272, for instance a public switched telephone network (PSTN), a local area network (LAN), a wide area network (WAN) etc. by means of transmitters/receivers 1273 responsible for input/output (I/O). The processor 1227 may be arranged to communicate with other communication systems via the communications network 1272. In an embodiment of the invention, external computers (not shown), for instance personal computers of operators, can log into the processor 1227 via the communications network 1272.

The processor 1227 may be implemented as an independent system or as a number of processing units that operate in parallel, wherein each processing unit is arranged to execute sub-tasks of a larger program. The processing units may also be divided in one or more main processing units with several sub-processing units. Some processing units of the processor 1227 may even be located a distance away of the other processing units and communicate via communications network 1272. Connections between modules can be made wired or wireless.

The computer system can be any signal processing system with analogue and/or digital and/or software technology arranged to perform the functions discussed here.

In an embodiment, there is provided a diagnostic apparatus for use in relation to an industrial process, the apparatus comprising a data processing apparatus programmed to perform the steps of: receiving object data for a set of product units that have been subjected nominally to the same industrial process, the object data for each product unit representing one or more parameters measured on the product unit at points spatially distributed across the product unit; defining a multidimensional space in which the object data for each of the product units can be represented as a vector; performing a multivariate analysis on the object data to obtain one or more component vectors in the multidimensional space; and extracting diagnostic information about the industrial process using the component vectors.

In an embodiment, the apparatus is adapted for use where the industrial process comprises a sequence of one or more lithographic processing steps performed on product units in the form of substrates, and arranged such that measurements made automatically in the performance of a lithographic patterning operation are captured and represented in the object data. In an embodiment, the measurements include positional deviations measured automatically at locations spatially distributed across each substrate in performance of the lithographic patterning operation. In an embodiment, in the vectors the positional deviations are expressed relative to a corrected position defined by an alignment model calculated from the positional deviations. In an embodiment, the apparatus is arranged to receive for use as the object data spatially distributed measurements of one or more of overlay, critical dimension, side wall angle, wafer quality, focus. In an embodiment, the apparatus is arranged to extract diagnostic information at least partly by designating certain product units as product units of interest based on the positions of their vectors when projected onto one or more of the component vectors. In an embodiment, the apparatus is arranged to designate as being of interest those product units whose vectors occupy outlying positions when projected onto a selected one of the component vectors. In an embodiment, the apparatus is arranged to designate as being of interest those product units whose vectors occupy an outlying region in a plane defined by a selected two or more of the component vectors. In an embodiment, the apparatus is further arranged to receive performance data representing one or more performance parameters measured for each product unit and further arranged to designate one or more of the component axes as being of interest, based on correlation observed between product units being designated as of interest according to the projection of their vectors onto the selected axis(axes) and product units designated as of interest according to the performance data. In an embodiment, the apparatus is adapted for use where the industrial process comprises a sequence of one or more lithographic processing steps performed on product units in the form of substrates, wherein the performance parameters include one or more of overlay, critical dimension, side wall angle, wafer quality, focus. In an embodiment, the apparatus is further arranged to receive context data representing one or more parameters of the industrial process as applied to each individual product unit, and further programmed to extract diagnostic information using the context data. In an embodiment, the apparatus is programmed to extract the diagnostic information at least partly by identifying correlation between the identification of product units as being of interest based on the component vectors and one or more parameters in the context data. In an embodiment, the apparatus is programmed to extract diagnostic information by displaying one- or more-dimensional plots of product unit distribution with selected parameters from the context data, the product units being represented in the plots in such a way that product units designated as being of interest can be distinguished visually from other product units. In an embodiment, the apparatus is adapted for use where the industrial process includes performing one or more lithographic, physical and/or chemical operations by different individual processing apparatuses on different individual product units, and wherein the context data includes at least one parameter identifying the individual processing apparatus used for a given operation. In an embodiment, the apparatus is programmed to extract diagnostic information at least partly by comparing vectors representing a particular product unit at different stages in the industrial process. In an embodiment, the extracting diagnostic information comprises: receiving sparse object data for one or more further product units that have been subjected nominally to the same industrial process as the set of product units, the sparse object data for the further product unit(s) representing the one or more parameters measured on the product unit(s) at points spatially distributed across the product unit with a lower density than the measurements received for the set of product units, analyzing the sparse object data by reference to at least a subset of the component vectors identified by the multivariate analysis; and combining the sparse object data with the component vectors in accordance with the result of the analyzing step, thereby to reconstruct object data representing the one or more parameters measured on the further product unit(s) at points spatially distributed across the product unit with a higher density than the sparse object data. In an embodiment, the analyzing the sparse object data is performed by reference to sparse versions of the component vectors, each sparse version of a component vector being generated by sub-sampling the component vector in accordance with the spatial distribution of the sparse object data. In an embodiment, the apparatus is further programmed to generate correction data for use in controlling the industrial process. In an embodiment, the apparatus is further programmed to generate context criteria for use in determining to which product units the correction should be applied by comparing the context criteria to further context data describing parameters of industrial process as applied to the further product units. In an embodiment, the apparatus is adapted for use where the industrial process comprises a mixture of lithographic patterning operations and physical and/or chemical operations, and programmed to generate the correction data for applying corrections in a lithographic patterning operation. In an embodiment, the apparatus further comprises a controller arranged to control a lithographic apparatus by applying corrections based on the extracted diagnostic information. In an embodiment, the object data prior to the multivariate analysis and the component vectors obtained by the multivariate analysis are both expressed as vectors in the same multidimensional space.

In an embodiment, there is provided a method of obtaining diagnostic information relating to an industrial process, the method comprising: receiving object data for a set of product units that have been subjected nominally to the same industrial process, the object data for each product unit representing one or more parameters measured on the product unit at points spatially distributed across the product unit; defining a multidimensional space in which the object data for each of the product units can be represented as a vector; performing a multivariate analysis on the object data to obtain one or more component vectors in the multidimensional space; and extracting diagnostic information about the industrial process using the component vectors.

In an embodiment, the industrial process comprises a sequence of one or more lithographic processing steps performed on product units in the form of substrates, each lithographic processing step comprising one or more lithographic patterning operations followed by one or more physical and/or chemical processing operations. In an embodiment, measurements made automatically in the performance of a lithographic patterning operation are captured and represented in the object data. In an embodiment, the measurements include positional deviations measured automatically using alignment marks spatially distributed across each substrate in performance of the lithographic patterning operation. In an embodiment, in the vectors the positional deviations are expressed relative to a corrected position defined by an alignment model calculated from the positional deviations. In an embodiment, the lithographic processing operation uses an alignment model that implements both lower order and higher order corrections, and wherein in the vectors the positional deviations are expressed relative to a corrected position defined by lower order corrections only. In an embodiment, the method further comprises generating one or more sets of correction data for use in controlling the industrial process when performed on further product units. In an embodiment, the extracting diagnostic information comprises: receiving sparse object data for one or more further product units that have been subjected nominally to the same industrial process as the set of product units, the sparse object data for the further product unit(s) representing the one or more parameters measured on the product unit(s) at points spatially distributed across the product unit with a lower density than the measurements received for the set of product units, analyzing the sparse object data by reference to at least a subset of the component vectors identified by the multivariate analysis, and combining the sparse object data with the component vectors in accordance with the result of the analyzing step, thereby to reconstruct object data representing the one or more parameters measured on the further product unit(s) at points spatially distributed across the product unit with a higher density than the sparse object data. In an embodiment, the analyzing the sparse object data is performed by reference to sparse versions of the component vectors, the sparse versions of the component vectors being generated by sub-sampling the component vectors in accordance with the spatial distribution of the sparse object data. In an embodiment, the object data prior to the multivariate analysis and the component vectors obtained by the multivariate analysis are both expressed as vectors in the same multidimensional space.

In an embodiment, there is provided a method of controlling an industrial process in which product units are subjected to one or more processing operations, the method comprising: measuring a plurality of product units that have been subjected to some or all of the processing operations to obtain object data representing for each product unit one or more parameters measured on the product unit at points spatially distributed across the product unit; using the object data to obtain diagnostic information by an apparatus as described herein or a method as described herein; and controlling the performance of the industrial process for subsequent product units based on the extracted diagnostic information. In an embodiment, the industrial process is a lithographic process for the manufacture of semiconductor devices, the processing operations including lithographic pattering operations and one or more physical and/or chemical processing operations, the product units comprising substrates, wherein the object data includes alignment data measured from the substrates in the course of at least one of the lithographic pattering operations. In an embodiment, the industrial process is a lithographic process for the manufacture of semiconductor devices, the processing operations including lithographic pattering operations and one or more physical and/or chemical processing operations, the product units comprising substrates, wherein the step of controlling the performance of the industrial process includes selectively applying alignment corrections in at least one of the lithographic pattering operations. In an embodiment, the industrial process is a lithographic process for the manufacture of semiconductor devices, the processing operations including lithographic pattering operations and one or more physical and/or chemical processing operations, the product units comprising substrates, wherein the object data includes at least one performance parameter measured from the substrates after performance of at least one of the lithographic pattering operations. In an embodiment, the extracting diagnostic information comprises: receiving sparse object data for one or more further product units that have been subjected nominally to the same industrial process as the set of product units, the sparse object data for the further product unit(s) representing the one or more parameters measured on the product unit(s) at points spatially distributed across the product unit with a lower density than the measurements received for the set of product units, analyzing the sparse object data by reference to at least a subset of the component vectors identified by the multivariate analysis, and combining the sparse object data with the component vectors in accordance with the result of the analyzing step, thereby to reconstruct object data representing the one or more parameters measured on the further product unit(s) at points spatially distributed across the product unit with a higher density than the sparse object data. In an embodiment, the decomposing the sparse object data is performed by reference to sparse versions of the component vectors, each sparse version of a component vector being generated by sub-sampling the component vector in accordance with the spatial distribution of the sparse object data.

In an embodiment, there is provided a computer program product comprising machine readable instructions for causing a general purpose data processing apparatus to implement a diagnostic apparatus as described herein or to perform a method as described herein.

In an embodiment, the computer program product further comprises machine readable instructions for causing the data processing apparatus to generate correction data and correction criteria by implementing a diagnostic apparatus as described herein or by performing a method as described herein.

In an embodiment, there is provided a method of controlling a lithographic apparatus wherein corrections are applied based on diagnostic information extracted from object data by an apparatus as described herein or a method as described herein.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. As already mentioned, embodiments of the invention may be applied in industrial processing applications quite separate from lithography. Examples might be in production of optical components, automotive manufacture, construction—any number of applications where object data exists in the form of measurements made with a certain spatial distribution over the product. As in the example of lithography. the set of measurements that is subjected to multivariate analysis can be measurements made for different product units, and/or different instances of measuring the same product units. Although specific reference may have been made above to the use of embodiments of the invention in the context of optical lithography, it will be appreciated that an embodiment of the invention may be used in other types of lithography, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The descriptions above are intended to be illustrative, not limiting. Thus, it will be apparent to one skilled in the art that modifications may be made to the invention as described without departing from the spirit and scope of the claims set out below. In addition, it should be appreciated that structural features or method steps shown or described in any one embodiment herein can be used in other embodiments as well.

The invention claimed is:

1. A non-transitory computer program product comprising machine readable instructions stored therein, the instructions, when executed by a computer system, configured to cause the computer system to at least:
   obtain measurement data comprising measurement values corresponding to different modes of measurement of a sensor system configured to sample on one or more marks on a physical product unit that has been subjected to a semiconductor manufacturing process;
   identify one or more components indicative of deformation of the one or more marks based on a result of a multivariate analysis applied to the measurement data or to previous measurement data; and
   use the measurement data and the identified one or more components to determine a preferred mode of measurement for the sensor system based on a reduced impact of the deformation of the one or more marks on the accuracy of a measurement value obtained by the sensor system.

2. The computer program product of claim 1, wherein the measurement values are associated with an overlay parameter and the one or more marks are overlay marks.

3. The computer program product of claim 2, wherein the mode of measurement of the sensor system is a wavelength of radiation used by the sensor system to sample the one or more marks.

4. The computer program product of claim 3, wherein the instructions are further configured to cause the computer system to select one or more further marks based on a further reduction of the impact of the mark deformation on the accuracy.

5. The computer program product of claim 1, wherein the identified one or more components are further based on performance data comprising measurement values corresponding to measurements by a different sensor.

6. The computer program product of claim 1, wherein the multivariate analysis is a Principal Component Analysis (PCA) and the components are principal components.

7. The computer program product of claim 6, wherein the components are based on a result of a PCA analysis applied to previous measurement data and the components are stored in a library.

8. The computer program product of claim 1, wherein the components are expressed as vectors in a multidimensional space.

9. The computer program product of claim 8, wherein the multidimensional space is a space of reduced dimensions.

10. The computer program product of claim 1, wherein the multivariate analysis is an Independent Component Analysis (ICA).

11. The computer program product of claim 1, wherein the instructions are further configured to cause the computer system to generate a recipe for the sensor system based on the preferred mode of measurement.

12. The computer program product of claim 1, wherein the sensor system is a metrology tool.

13. A metrology tool comprising the computer program product according to claim 1, wherein the sensor system is the metrology tool.

14. The computer program product of claim 1, wherein the sensor system is an alignment sensor of a lithographic apparatus and the one or more marks are alignment marks.

15. The computer program product of claim 14, wherein the mode of measurement of the alignment sensor is a wavelength of radiation used by the alignment sensor to sample the alignment marks.

16. The computer program product of claim 15, wherein the instructions are further configured to cause the computer system to select one or more further alignment marks based on a further reduction of the impact of deformation of the alignment marks on the accuracy.

17. A lithographic apparatus comprising:
   an alignment sensor; and
   the computer program product of claim 1, wherein the sensor system is the alignment sensor and the one or more marks are alignment marks.

18. A method comprising:
   obtaining measurement data comprising measurement values corresponding to different modes of measurement of a sensor system configured to sample on one or more marks on a physical product unit that has been subjected to a semiconductor manufacturing process;
   identifying, by a hardware computer system, one or more components indicative of deformation of the one or more marks based on a result of a multivariate analysis applied to the measurement data or previous measurement data; and
   using the measurement data and the identified one or more components to determine a preferred mode of measurement for the sensor system based on a reduced impact of the deformation of the one or more marks on the accuracy of a measurement value obtained by the sensor system.

19. The method of claim 18, wherein the measurement values are associated with an overlay parameter and the one or more marks are overlay marks.

20. The method of claim 19, wherein the mode of measurement of the sensor system is a wavelength of radiation used by the sensor system to sample the one or more marks.

* * * * *